US008878559B2

(12) United States Patent
Nakayama et al.

(10) Patent No.: US 8,878,559 B2
(45) Date of Patent: Nov. 4, 2014

(54) IC CURRENT MEASURING APPARATUS AND IC CURRENT MEASURING ADAPTER

(75) Inventors: Takeshi Nakayama, Hyogo (JP); Yoshiyuki Saito, Osaka (JP); Masahiro Ishii, Hyogo (JP); Kouichi Ishino, Osaka (JP); Yukihiro Ishimaru, Osaka (JP)

(73) Assignee: Panasonic Corporation, Osaka (JP)

( * ) Notice: Subject to any disclaimer, the term of this patent is extended or adjusted under 35 U.S.C. 154(b) by 331 days.

(21) Appl. No.: 13/382,690

(22) PCT Filed: Apr. 19, 2011

(86) PCT No.: PCT/JP2011/002274
§ 371 (c)(1),
(2), (4) Date: Jan. 6, 2012

(87) PCT Pub. No.: WO2011/145269
PCT Pub. Date: Nov. 24, 2011

(65) Prior Publication Data
US 2012/0112737 A1 May 10, 2012

(30) Foreign Application Priority Data

May 19, 2010 (JP) ................. 2010-114894

(51) Int. Cl.
*G01R 31/26* (2014.01)
*G01R 31/28* (2006.01)
*G01R 1/20* (2006.01)
*G01R 31/02* (2006.01)

(52) U.S. Cl.
CPC ............ *G01R 1/203* (2013.01); *G01R 31/2801* (2013.01); *G01R 31/2886* (2013.01); *G01R 31/2889* (2013.01); *G01R 31/021* (2013.01); *G01R 31/2896* (2013.01)
USPC ................. 324/756.01; 324/763.01; 324/691; 324/512; 324/522; 324/762.01; 257/737; 257/779; 438/15; 438/18

(58) Field of Classification Search
CPC .... G01R 31/02; G01R 31/021; G01R 31/024; G01R 31/2884; G01R 31/2886; G01R 31/2896; G01R 31/2851; G01R 31/2801; G01R 27/02; H01L 2224/73204; H01L 2224/73203
USPC ............... 324/756.01, 763.01, 691, 512, 522, 324/525, 713, 762.01, 762.02, 757.04, 324/756.07, 757.02; 257/737, E23.069, 257/779; 438/15, 18
See application file for complete search history.

(56) References Cited

U.S. PATENT DOCUMENTS

| 5,477,160 | A | * | 12/1995 | Love .................. 324/756.02 |
| 5,754,410 | A | * | 5/1998 | Bardsley et al. ............ 361/777 |
| 6,026,221 | A | * | 2/2000 | Ellison et al. ................ 700/121 |
| 6,590,409 | B1 | * | 7/2003 | Hsiung et al. ............ 324/754.22 |
| 6,759,860 | B1 | * | 7/2004 | Hsiung et al. ............ 324/750.19 |
| 6,781,218 | B1 | * | 8/2004 | Wilsher ..................... 257/662 |
| 7,541,823 | B2 | * | 6/2009 | Shimoda et al. ......... 324/754.11 |
| 2003/0008424 | A1 | * | 1/2003 | Kajiwara et al. ............. 438/18 |
| 2004/0100293 | A1 | * | 5/2004 | Bottcher et al. ............. 324/754 |
| 2008/0088335 | A1 | * | 4/2008 | Blanchet et al. ............. 324/765 |

FOREIGN PATENT DOCUMENTS

| CN | 101009268 | 8/2007 |
| JP | 5-134002 | 5/1993 |
| JP | 2000-111617 | 4/2000 |
| JP | 2005-315775 | 11/2005 |
| JP | 2009-276090 | 11/2009 |

OTHER PUBLICATIONS

International Search Report issued Aug. 2, 2011 in International (PCT) Application No. PCT/JP2011/002274.
Chinese Office Action issued Apr. 2, 2014 in corresponding Application No. 201180002931.X (with English translation).

* cited by examiner

*Primary Examiner* — Tung X Nguyen
*Assistant Examiner* — Thang Le
(74) *Attorney, Agent, or Firm* — Wenderoth, Lind & Ponack, L.L.P.

(57) ABSTRACT

An IC current measuring apparatus is provided between an IC and a substrate. The IC current measuring apparatus electrically connects each of a plurality of IC-facing terminals and a different one of a plurality of substrate-facing terminals. Especially, resistances are each inserted into a path between an IC terminal targeted for measurement and a substrate terminal corresponding thereto. Furthermore, the IC current measuring apparatus is provided with terminals each used to measure a voltage between both ends of an inserted resistance corresponding thereto. Accordingly, a measurer who measures current flowing through an IC-facing terminal can measure the current flowing through the IC-facing terminal by providing the IC current measuring apparatus between the IC targeted for measurement and the substrate and measuring a voltage between both ends of an inserted resistance corresponding to the IC terminal through which current he/she wishes to measure flows.

11 Claims, 14 Drawing Sheets

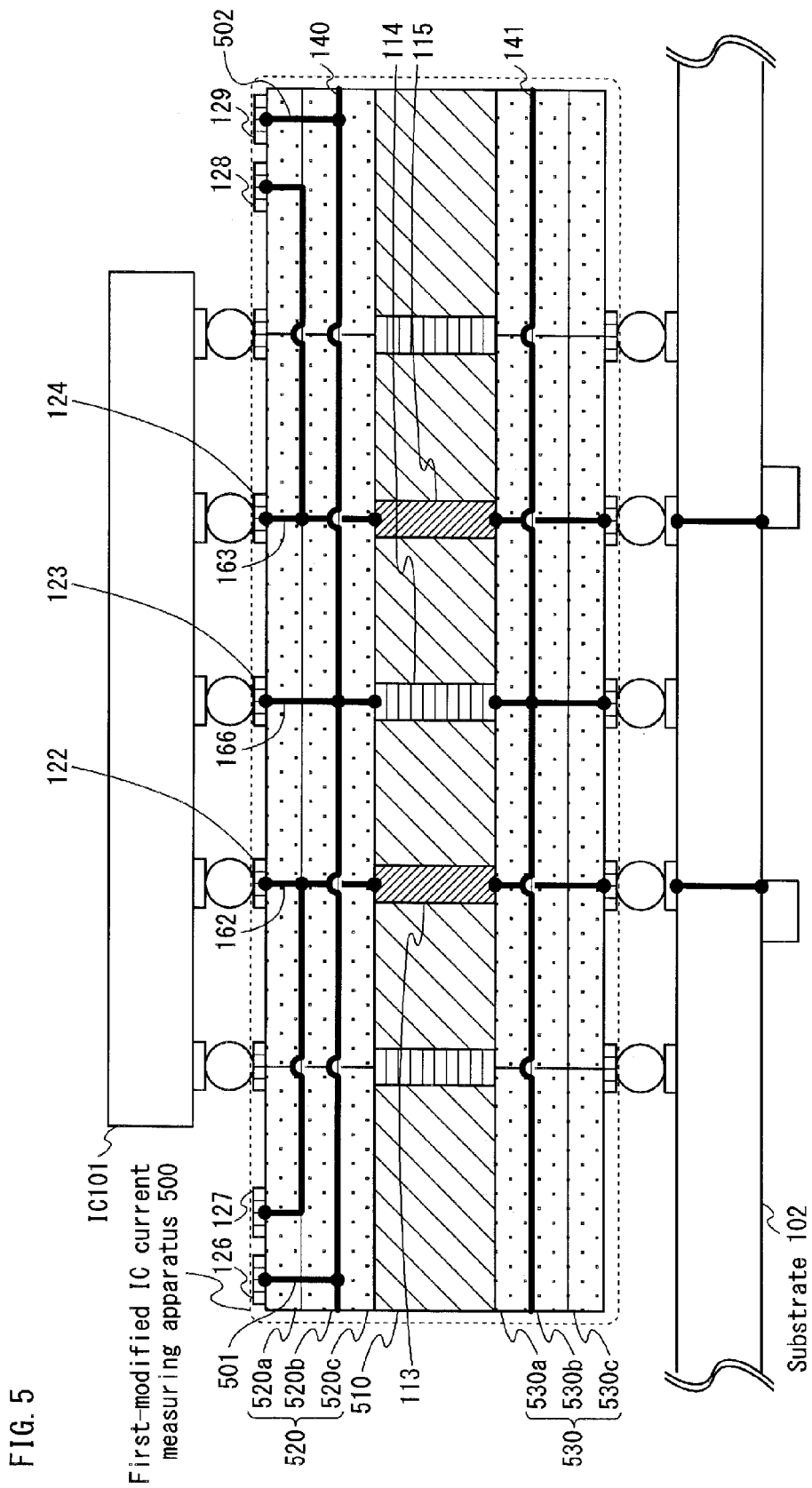

IC CURRENT MEASURING APPARATUS AND IC CURRENT MEASURING ADAPTER

BACKGROUND OF INVENTION

The present invention relates to an IC current measuring apparatus for measuring current flowing through an integrated circuit (IC).

BACKGROUND ART

There has been known a technology for measuring current consumed by an IC in operation.

For example, Patent Literature 1 discloses a technology for measuring the total amount of current consumed by an IC as follows. An adapter for separating an IC power source and a substrate power source is inserted between an IC and a substrate. An ammeter is connected between a positive testing terminal of the adapter that is connected to the IC power source and a negative testing terminal of the adapter that is connected to the substrate power source in order to measure the total amount of current.

CITATION LIST

Patent Literature

[Patent Literature 1]
Japanese Unexamined Patent Application Publication No. H5-134002

SUMMARY OF INVENTION

However, the above conventional art can only measure the total amount of current flowing through the IC with the connected ammeter, but cannot measure current flowing through each of a plurality of terminals included in the IC.

The present invention has been achieved in view of the above problem. An aim thereof is to provide an IC current measuring apparatus that is provided between an IC and a substrate in order to measure current flowing through the plurality of terminals of the IC and that can individually measure current that flows through each of the plurality of terminals of the IC.

In order to solve the above problem, an IC current measuring apparatus pertaining to the present invention for measuring current flowing through a plurality of terminals of an IC while being connected between the IC and a substrate, the IC current measuring apparatus comprises: a plurality of IC-facing terminals each to be connected to a different one of the plurality of terminals of the IC; a plurality of substrate-facing terminals each (i) to be connected to a different one of a plurality of terminals of the substrate and (ii) electrically connected to a different one of the plurality of IC-facing terminals; a first element to generate a voltage in accordance with current flowing between a first IC-facing terminal and one of the plurality of substrate-facing terminals that corresponds to the first IC-facing terminal, the first IC-facing terminal being one of the plurality of IC-facing terminals; a second element to generate a voltage in accordance with current flowing between a second IC-facing terminal and one of the plurality of substrate-facing terminals that corresponds to the second IC-facing terminal, the second IC-facing terminal being one of the plurality of IC-facing terminals; a first lead-out terminal to output the voltage generated by the first element to the outside; and a second lead-out terminal to output the voltage generated by the second element to the outside.

The IC current measuring apparatus pertaining to the present invention with the above structure can measure (i) current flowing between the first IC-facing terminal and the substrate-facing terminal that corresponds to the first IC-facing terminal by measuring a voltage that occurs at the first element with use of the first lead-out terminal and (ii) current flowing between the second IC-facing terminal and the substrate-facing terminal that corresponds to the second IC-facing terminal by measuring a voltage that occurs at the second element with use of the second lead-out terminal.

Accordingly, the present invention offers an effect of individually measuring current that flows through the first IC-facing terminal and current that flows through the second IC-facing terminal.

BRIEF DESCRIPTION OF DRAWINGS

FIG. 5 is a cross-sectional view of a first-modified IC current measuring apparatus 500.

DETAILED DESCRIPTION OF INVENTION

[First Embodiment]

As an embodiment of the IC current measuring apparatus pertaining to the present invention, the following describes an IC current measuring apparatus for measuring current flowing through each of power source terminals of an IC that is provided with a total of 5×5=25 terminals packaged in a Ball Grid Array (BGA) package.

By being provided between the IC and a substrate, the IC current measuring apparatus electrically connects terminals of the IC to respective terminals of the substrate. Especially, with regard to power source terminals, a resistance of 1Ω is inserted into each of current paths between power source terminals of the IC and respective power source terminals of the substrate.

Furthermore, the IC current measuring apparatus is provided with terminals each for measuring a voltage between both ends of each inserted resistance.

Accordingly, a measurer who measures current flowing through the power source terminals of the IC can measure the current flowing through each of the power source terminals of the IC in operation by (i) providing the IC current measuring apparatus between the IC that is targeted for measurement and the substrate and (ii) measuring a voltage between both ends of an inserted resistance that corresponds to each power source terminal through which the current that he/she wishes to measure flows.

A structure of an IC current measuring apparatus pertaining to a first embodiment is described below with reference to the drawings.

<Structure>

Figure 1:
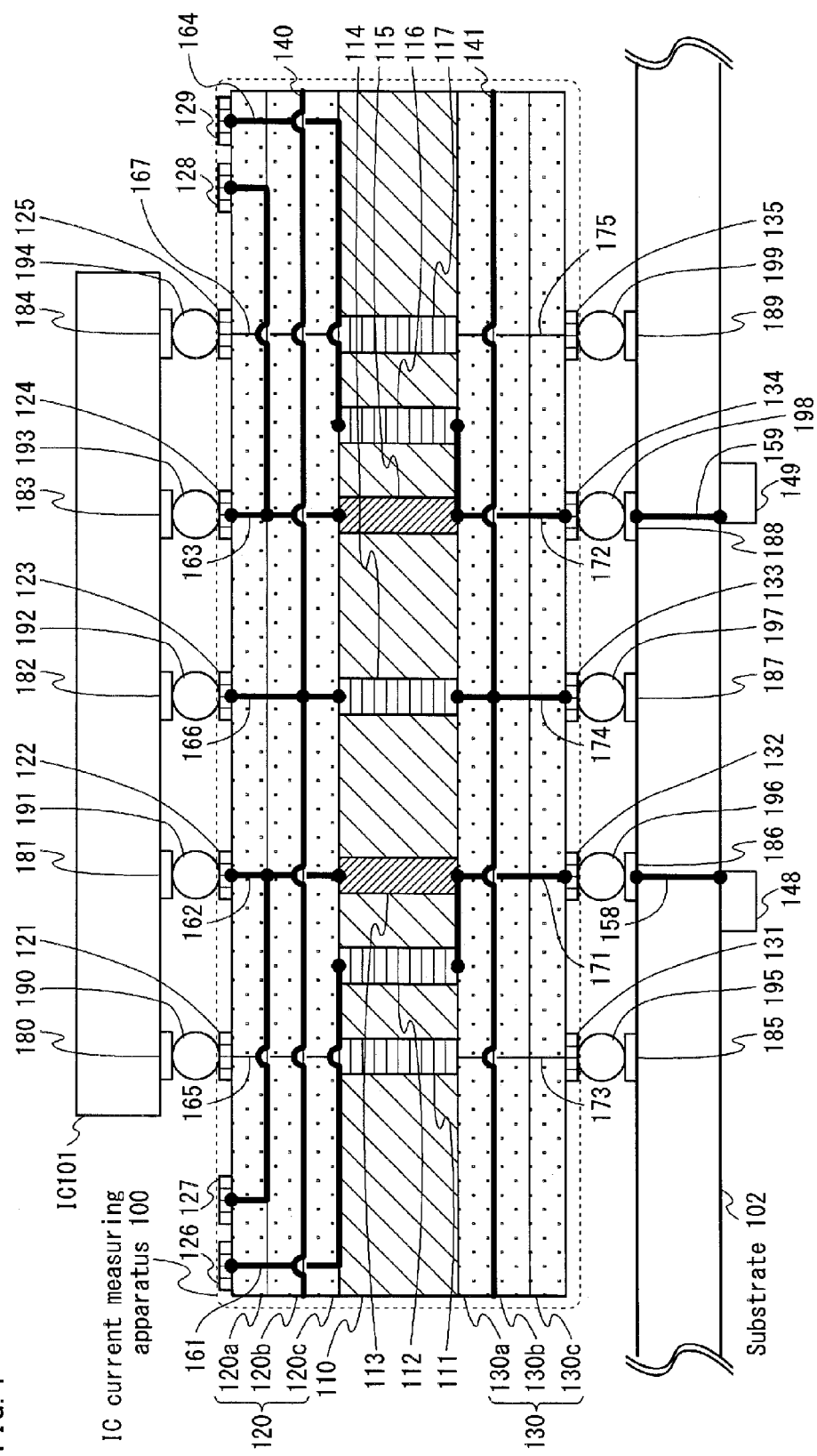
FIG. 1 is a cross-sectional view of an IC current measuring apparatus 100.

FIG. 1 is a cross-sectional view of an IC current measuring apparatus 100 that is provided between an IC 101 and a substrate 102.

The IC 101 is provided with a total of 5×5=25 IC terminals packaged in a BGA package and contains a circuit that operates at 667 MHz, for example. In the cross section shown in FIG. 1, IC terminals 180-184 are provided to the IC 101.

Among the IC terminals in the cross section shown in FIG. 1, the IC terminals 181 and 183 are power source terminals, and the IC terminal 182 is a ground terminal.

When terminals unillustrated in FIG. 1 are included, among the 25 IC terminals of the IC 101, 8 terminals are power source terminals and other 8 terminals are ground terminals.

A substrate 102 is provided with 25 substrate terminals corresponding to the respective IC terminals of the IC 101. In the cross section shown in FIG. 1, substrate terminals 185-189 are provided to the substrate 102.

With regard to relative positional relationships, relative positions of the substrate terminals match relative positions of the respective IC terminals.

Among the substrate terminals in the cross section shown in FIG. 1, the substrate terminals 186 and 188 are power source terminals, and the substrate terminal 187 is a ground terminal.

When terminals unillustrated in FIG. 1 are included, among the 25 substrate terminals of the substrate 102, 8 terminals are power source terminals and other 8 terminals are ground terminals.

The substrate 102 is further provided with, in vicinity to the respective power source terminals, by-pass capacitors that are each connected to a different one of the power source terminals of the substrate 102. In the cross section shown in FIG. 1, in vicinity to the substrate terminal 186 that is a power source terminal, a by-pass capacitor 148 connected to the substrate terminal 186 is provided, and in vicinity to the substrate terminal 188 that is a power source terminal, a by-pass capacitor 149 connected to the substrate terminal 188 is provided.

The IC current measuring apparatus 100 is composed of a layered substrate formed by layering a wiring layer 120, a component-containing layer 110, and a wiring layer 130. In the cross section shown in FIG. 1, the IC current measuring apparatus 100 includes the IC-facing terminals 121-125 and lead-out terminals 126-129 on a main surface thereof facing the IC 101, and substrate-facing terminals 131-135 on a main surface thereof facing the substrate 102.

When terminals unillustrated in FIG. 1 are included, the IC current measuring apparatus 100 is provided with 25 IC-facing terminals and 16 lead-out terminals on the main surface thereof facing the IC 101, and 25 substrate-facing terminals on the main surface thereof facing the substrate 102.

The component-containing layer 110 is a substrate made of a material such as thermosetting resin and the width thereof is 0.6 mm, for example. The component-containing layer 110 contains a plurality of conductive vias (for example, made of copper) and a plurality of resistance elements of 1Ω, the vias and the resistance elements piercing the component-containing layer 110 between the main surface thereof facing the IC 101 and the main surface thereof facing the substrate 102. In the cross section shown in FIG. 1, a via 111, a via 112, a resistance element 113, a via 114, a resistance element 115, a via 116, and a via 117 are provided to the component-containing layer 110.

Each resistance element included in the component-containing layer 110 is a chip resistance whose size is 0.6 mm×0.3 mm×0.3 mm, for example, which is commercially available at a low price and easily accessible.

The wiring layer 120 is formed by layering a first substrate 120a, a second substrate 120b, and a third substrate 120c, and provided with metal wiring (for example, made of copper) and conductive contact holes (for example, made of copper). The wiring layer 120 electrically connects an IC-facing terminal or a lead-out terminal to the upper end of a via included in the component-containing layer 110 or the upper end of a resistance element included in the component-containing layer 110. The width of the wiring layer 120 is 0.3 mm, for example.

A via and a contact hole are substantially the same. However, here, what are included in the wiring layers 120 and the wiring layer 130 are called contact holes, and what are included in the component-containing layer 110 are called vias.

In addition, between the second substrate 120b and the third substrate 120c, a first ground plane 140 made of a thin metal plate material (for example, made of copper) is formed.

With the first ground plane 140 between the second substrate 120b and the third substrate 120c, wiring between the first substrate 120a and the second substrate 120b and the first ground plane become electrically capacitively coupled with each other, and also, wiring of a bottom surface of the third substrate 120c and the first ground plane become electrically capacitively coupled with each other.

The wiring layer 130 is formed by layering a fourth substrate 130a, a fifth substrate 130b, and a sixth substrate 130c, and provided with metal wiring (for example, made of copper) and conductive contact holes (for example, made of copper). The wiring layer 130 electrically connects a substrate-facing terminal to the lower end of a via included in the component-containing layer 110 or the lower end of a resistance element included in the component-containing layer 110. The width of the wiring layer 130 is 0.3 mm, for example.

In addition, between the fourth substrate 130a and the fifth substrate 130b, a second ground plane 141 made of a thin metal plate material (for example, made of copper) is formed.

With the second ground plane 141 between the fourth substrate 130a and the fifth substrate 130b, wiring on a surface of the fourth substrate 130a and the second ground plane become electrically capacitively coupled with each other. Also, wiring between the fifth substrate 130b and the sixth substrate 130c and the second ground plane become electrically capacitively coupled with each other.

The IC-facing terminals 121-125 are provided on the main surface of the IC current measuring apparatus 100 facing the IC 101. The IC-facing terminals 121-125 are each for being connected to a different one of the IC terminals 180-184. The IC-facing terminals 121-125 are connected to the IC terminals 180-184 by pieces of solder 190-194, respectively.

The IC-facing terminals unillustrated in FIG. 1 are also provided on the main surface of the IC current measuring apparatus 100 facing the IC 101, like the IC-facing terminals 121-125. The unillustrated IC-facing terminals are each for being connected to a different one of IC terminals. The unillustrated IC-facing terminals are connected to the respective IC terminals by pieces of solder.

Among the IC-facing terminals in the cross section shown in FIG. 1, the IC-facing terminal 122 and the IC-facing terminal 124 are power source terminals, and the IC-facing terminal 123 is a ground terminal.

The substrate-facing terminals 131-135 are provided on the main surface of the IC current measuring apparatus 100 facing the substrate 102. The substrate-facing terminals 131-135 are each for being connected to a different one of the substrate terminals 185-189. The substrate-facing terminals 131-135 are connected to the substrate terminals 185-189 by pieces of solder 195-199, respectively.

The substrate-facing terminals unillustrated in FIG. 1 are also provided on the main surface of the IC current measuring apparatus 100 facing the substrate 102, like the substrate-facing terminals 131-135. The unillustrated substrate-facing terminals are each for being connected to a different one of substrate terminals. The unillustrated substrate-facing terminals are connected to the respective substrate terminals by pieces of solder.

In addition, each substrate-facing terminal is disposed at a position opposite a different one of the IC-facing terminals.

Among the substrate-facing terminals in the cross section shown in FIG. 1, the substrate-facing terminals 132 and 134 are power source terminals, and the substrate-facing terminal 133 is a ground terminal.

The lead-out terminals 126 and 127 are disposed on the main surface of the IC current measuring apparatus 100 facing the IC 101, and used to measure a voltage between the upper end and lower end of the resistance element 113. The lead-out terminals 128 and 129 are disposed on the main surface of the IC current measuring apparatus 100 facing the IC 101, and used to measure a voltage between the upper end and lower end of the resistance element 115.

Lead-out terminals unillustrated in FIG. 1 are also disposed on the main surface of the IC current measuring apparatus 100 facing the IC 101, like the lead-out terminals 126-129, and each pair of the unillustrated lead-out terminals are used to measure a voltage between the upper end and lower end of a resistance element corresponding thereto.

A pair of lead-out terminals correspond to one resistance element.

<Connection between Terminals>

Each of the IC-facing terminals that is neither a power source terminal nor a ground terminal is connected to a different one of the substrate-facing terminals through a contact hole of the first substrate 120a, a contact hole of the second substrate 120b, a contact hole of the third substrate 120c, a via of the component-containing layer 110, a contact hole of the fourth substrate 130a, a contact hole of the fifth substrate 130b, and a contact hole of the sixth substrate 130c, which are aligned as a straight line.

For example, the IC-facing terminal 121 in the cross section shown in FIG. 1, which is neither a power source terminal nor a ground terminal, is connected to the upper end of the via 111 through a wiring path 165 formed by contact holes that are vertically stacked as a straight line. The lower end of the via 111 is connected to the substrate-facing terminal 131 through a wiring path 173 formed by contact holes that are vertically stacked as a straight line.

Each of the ground terminals among the IC-facing terminals is connected to a different one of the ground terminals among the substrate-facing terminals through a contact hole of the first substrate 120a, a contact hole of the second substrate 120b, a contact hole of the third substrate 120c, a via of the component-containing layer 110, a contact hole of the fourth substrate 130a, a contact hole of the fifth substrate 130b, and a contact hole of the sixth substrate 130c, which are aligned as a straight line. Each ground terminal among the IC-facing terminals is further connected to the first ground plane 140 and the second ground plane 141.

For example, the IC-facing terminal 123 in the cross section shown in FIG. 1, which is a ground terminal, is connected to the first ground plane 140 and the upper end of the via 114 through a wiring path 166 formed by contact holes that are vertically stacked as a straight line. The lower end of the via 114 is connected to the second ground plane 141 and the substrate-facing terminal 133, which is a ground terminal, through a wiring path 174 formed by contact holes that are vertically stocked as a straight line.

The power source terminals among the IC-facing terminals are each connected to a different one of the power source terminals among the substrate-facing terminals through a contact hole of the first substrate 120a, a contact hole of the second substrate 120b, a contact hole of the third substrate 120c, a resistance element of the component-containing layer 110, a contact hole of the fourth substrate 130a, a contact hole of the fifth substrate 130b, and a contact hole of the sixth substrate 120c, which are aligned as a straight line.

In addition, with regard to each power source terminal among the IC-facing terminals, the upper end of each resistance element is connected to one of a corresponding pair of lead-out terminals through a contact hole of the third substrate 120c, a contact hole of the second substrate 120b, wiring between the first substrate 120a and the second substrate 120b, and a contact hole of the first substrate 120a, and the lower end of the resistance element is connected to the other of the pair of lead-out terminals through wiring on a surface of the fourth substrate 130a, a via of the component-containing layer 110, wiring on a bottom surface of the third substrate 120c, a contact hole of the third substrate 120c, a contact hole of the second substrate 120b, and a contact hole of the first substrate 120a.

For example, in the cross section shown in FIG. 1, the IC-facing terminal 124, which is the power source terminal, is connected to the upper end of the resistance element 115 and the lead-out terminal 128 through a wiring path 163 formed by contact holes and wiring. The lower end of the resistance element 115 is connected to the lower end of the via 116 and the substrate-facing terminal 134 through a wiring path 172 formed by contact holes and wiring, and the upper end of the via 116 is connected to the lead-out terminal 129 through a wiring path 164 formed by contact holes and wiring.

Figure 2:
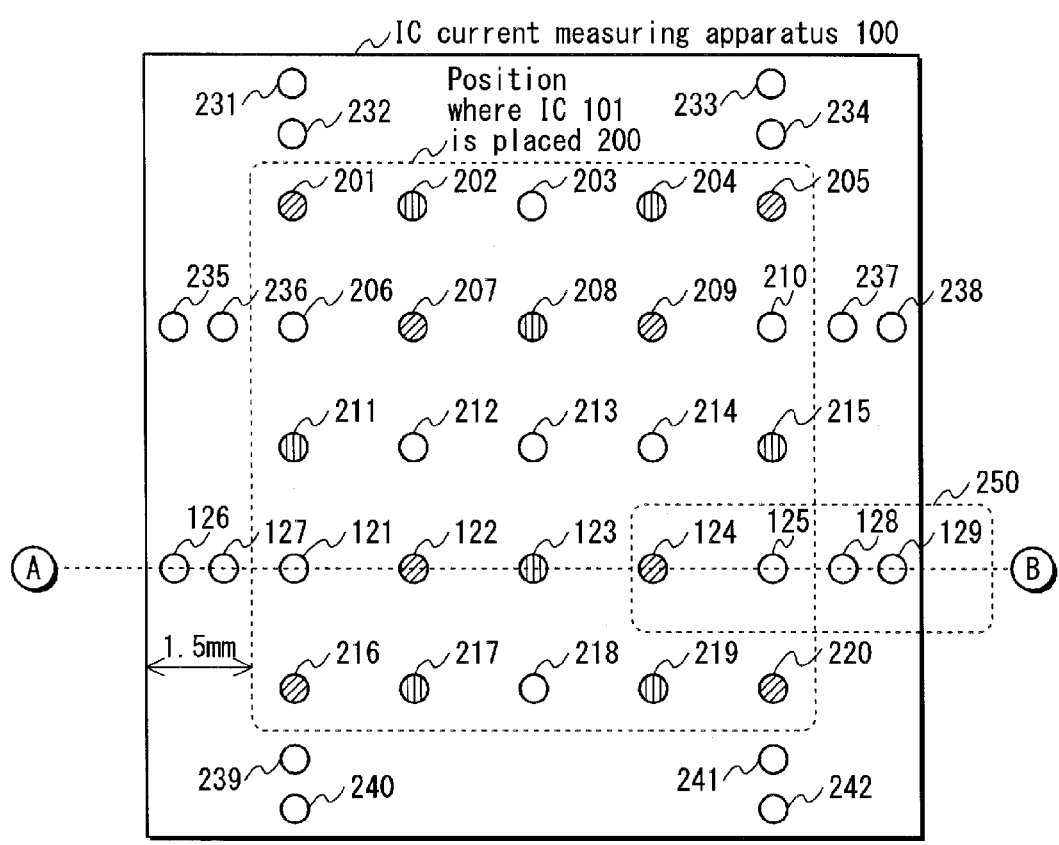
FIG. 2 is a plan view of the IC current measuring apparatus 100, as viewed from the above.

FIG. 2 is a plan view of the IC current measuring apparatus 100, as viewed from the above. A plane vertical to the main surface of the IC current measuring apparatus 100 facing IC 101, which contains a line segment that connects a point A and a point B shown in FIG. 2, is a cross section of the IC current measuring apparatus 100 shown in FIG. 1.

The main surface of the IC current measuring apparatus 100 facing the IC 101 is provided with a total of 25 IC-facing terminals, that is, the IC-facing terminals 121-125 and IC-facing terminals 201-220, and a total of 16 lead-out terminals, that is, the lead-out terminals 126-129 and lead-out terminals 231-242.

Among the IC-facing terminals, the IC-facing terminals 201, 205, 207, 209, 122, 124, 216, and 220 are power source terminals, and the IC-facing terminals 202, 204, 208, 211, 215, 123, 216, and 220 are ground terminals.

The lead-out terminals 126 and 127 are used to measure a voltage between both ends of a resistance element connected to the IC-facing terminal 122, which is a power source terminal. The lead-out terminals 128 and 129 are used to measure a voltage between both ends of a resistance element connected to the IC-facing terminal 124, which is a power source terminal. The lead-out terminals 231 and 232 are used to measure a voltage between both ends of a resistance element connected to the IC-facing terminal 201, which is a power source terminal. The lead-out terminals 233 and 234 are used to measure a voltage between both ends of a resistance element connected to the IC-facing terminal 205, which is a power source terminal. The lead-out terminals 235 and 236 are used to measure a voltage between both ends of a resistance element connected to the IC-facing terminal 207, which is a power source terminal. The lead-out terminals 237 and 238 are used to measure a voltage between both ends of a resistance element connected to IC-facing terminal 209, which is a power source terminal. The lead-out terminals 239 and 240 are used to measure a voltage between both ends of a resistance element connected to the IC-facing terminal 216, which is a power source terminal. The lead-out terminals 241 and 242 are used to measure a voltage between both ends of a resistance element connected to the IC-facing terminal 220, which is a power source terminal.

A distance from each of sides of the IC current measuring apparatus 100 to the corresponding one of sides of the IC 101 is 1.5 mm, when the IC 101 is being attached.

Figure 3:
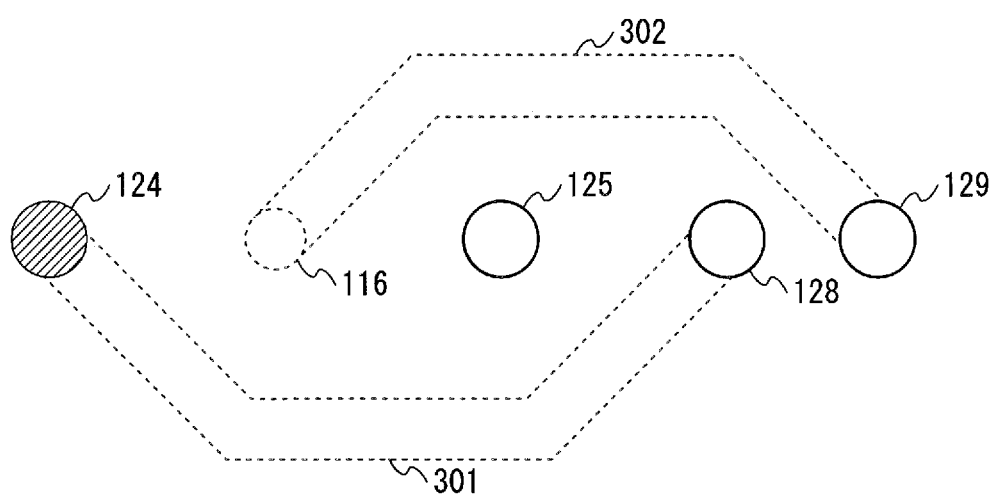
FIG. 3 is an enlarged plan view of a part of the plan view of the IC current measuring apparatus 100.

FIG. 3 is an enlarged plan view of an area 250 in FIG. 2.

Dashed lines in FIG. 3 show components such as wiring and a via that are included inside the IC current measuring apparatus 100. For the sake of convenience, the components are described as if they were seen from outside the IC current measuring apparatus 100, but in practice, the components cannot be directly seen from outside the IC current measuring apparatus 100.

Wiring 301 is a piece of wiring formed between the first substrate 120a (see FIG. 1) and the second substrate 120b (see FIG. 1) among a plurality of pieces of wiring that connect the IC-facing terminal 124 and the lead-out terminal 128, and avoids a contact hole located under the IC-facing terminal 125.

Wiring 302 is a piece of wiring formed on a bottom surface of the third substrate 120c (see FIG. 1) among a plurality of pieces of wiring that connects the upper end of the via 116 and the lead-out terminal 129, and avoids a contact hole located under the IC-facing terminal 125.

<Method for Measuring Current Using Ic Current Measuring Apparatus 100>

When current flows through a resistance element, a voltage in accordance with the current occurs between both ends of the resistance element.

Here, since a resistance value of each resistance element inserted into the IC current measuring apparatus 100 is 1Ω, a voltage v (V) between both ends of each resistance element indicates current i (A) that flows through each resistance element as-is.

Accordingly, a measurer who measures current flowing through the power source terminals of the IC 101 can measure current flowing through each of the power source terminals of the IC 101 that are targeted for measurement by receiving a voltage between both ends of a resistance element corresponding to each power source terminal, that is, a voltage between a pair of lead-out terminals corresponding to the resistance element, for example, by a spectrum analyzer with use of a differential active probe and the like.

<Concrete Example of Current Measured with IC Current Measuring Apparatus 100>

Measured current contains various frequency components.

By performing Fourier transform on the measured current, it becomes possible to visually confirm the frequency components contained in the current.

Some spectrum analyzers commercially available have a function to (i) perform Fourier transform on current that has been measured for a predetermined time period based on a frequency contained in the current and (ii) output the current on which Fourier transform has been performed.

Figure 4A:
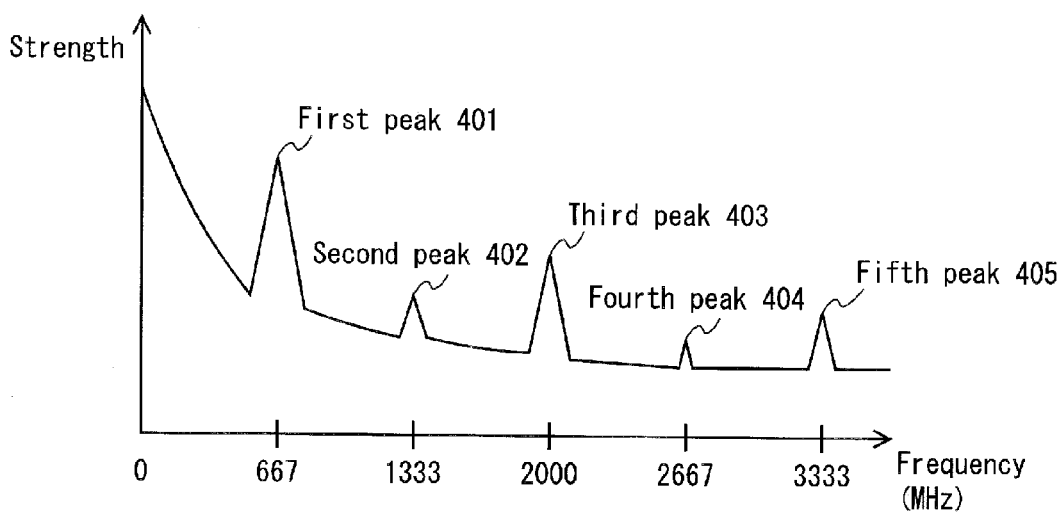
FIGS. 4A-4C show characteristics that are obtained when Fourier transform is performed on measured current.
Figure 4B:
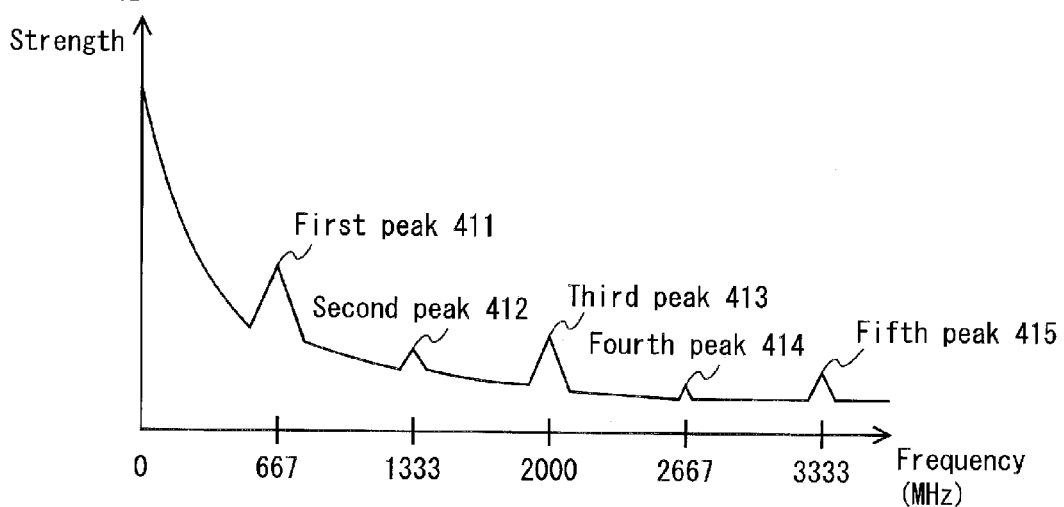
Figure 4C:
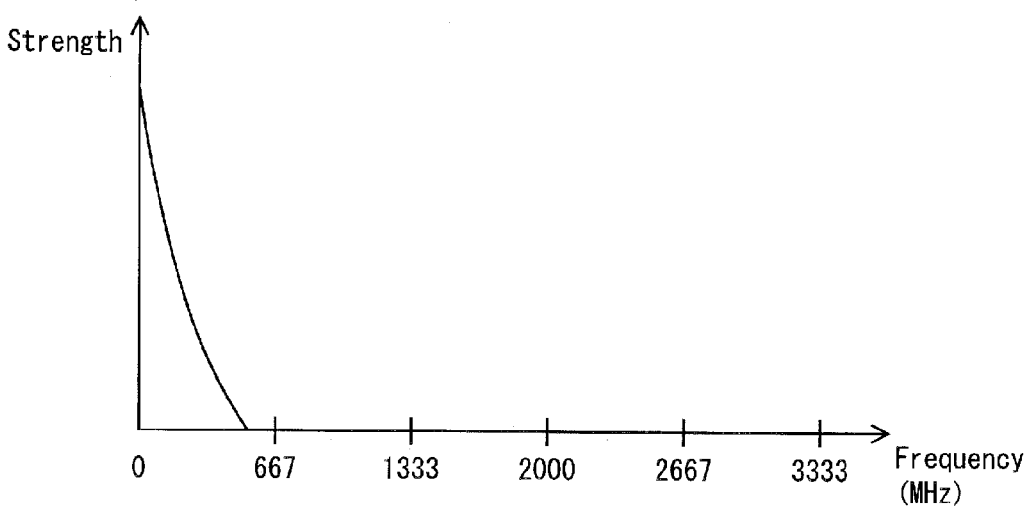

FIGS. 4A-4C show frequency characteristics of current fed to the power source terminals of the IC. The frequency characteristics are obtained by performing Fourier transform on current flowing through the power source terminals of the IC 101 that has been measured for a predetermined time period (for example, one second) based on a frequency contained in the current, using the IC current measuring apparatus 100.

The current flowing through the power source terminals contains various frequency components.

FIG. 4A shows a frequency characteristic of current flowing through an IC terminal corresponding to the IC-facing terminal 122 (see FIG. 2) (hereinafter, IC power source terminal A), which is a power source terminal, for example.

As shown in FIG. 4A, the first peak 401 appears at a position where a frequency component is 667 MHz, and the second peak 402 through the fifth peak 405 appear at positions whose frequency components are each equal to the integral multiple of 667 MHz.

According to this, it can be seen that current is fed through the IC power source terminal A to a circuit that operates at 667 MHz inside the IC 101.

FIG. 4B shows a frequency characteristic of current flowing through an IC terminal corresponding to the IC-facing terminal 220 (see FIG. 2) (hereinafter, IC power source terminal B), which is a power source terminal, for example.

As shown in FIG. 4B, the first peak 411 appears at a position where a frequency component is 667 MHz, and the second peak 412 through the fifth peak 415 appear at positions whose frequency components are each equal to the integral multiple of 667 MHz.

In addition, strengths of the first peak 411 through the fifth peak 415 in FIG. 4B become small, compared with strengths of the first peak 401 through the fifth peak 405 in FIG. 4A, respectively.

According to this, it can be seen that although current is fed through the IC power source terminal B to the circuit that operates at 667 MHz inside the IC 101, an amount of the fed current is small, compared with the IC power source terminal A.

FIG. 4C shows a frequency characteristic of current flowing through an IC terminal corresponding to the IC-facing terminal 205 (see FIG. 2) (hereinafter, IC power source terminal C), which is a power source terminal, for example.

As shown in FIG. 4C, a peak does not appear at positions whose frequency components are each equal to the integral multiple of 667 MHz.

According to this, it can be seen that current is not fed through the IC power source terminal C to the circuit that operates at 667 MHz inside the IC 101.

According to the IC current measuring apparatus 100 described above, it is possible to independently measure current flowing through each of the power source terminals of the IC 101 in operation.

[Second Embodiment]

As an embodiment of the IC current measuring apparatus pertaining to the present invention, a first-modified IC current measuring apparatus pertaining to a second embodiment is described below. The first-modified IC current measuring apparatus is formed by modifying a part of the IC current measuring apparatus 100 pertaining to the first embodiment.

Each of the pairs of lead-out terminals of the IC current measuring apparatus 100 are used to measure a voltage between the upper end of a resistance element and the lower end of the resistance element. However, each pair of lead-out terminals of the first-modified IC current measuring apparatus is used to measure a difference between a potential of the upper end of a resistance element and a ground potential.

The following describes a structure of the first-modified IC current measuring apparatus pertaining to the second embodiment with reference to the drawing. The description centers on a difference from the IC current measuring apparatus 100 pertaining to the first embodiment.

FIG. 5 is a cross-sectional view of a first-modified IC current measuring apparatus 500 that is provided between the IC 101 and the substrate 102.

The IC current measuring apparatus 100 has been modified to the first-modified IC current measuring apparatus 500 by changing the wiring layer 120 to a wiring layer 520, the component-containing layer 110 to a component-containing layer 510, and the wiring layer 130 to a wiring layer 530 so that a potential of one lead-out terminal of each pair of lead-out terminals that is closer to the side surface of the first-modified IC current measuring apparatus 500 becomes a ground potential.

The wiring layer 520 is formed by modifying a part of wiring paths of the wiring layer 120. That is, one terminal of each pair of lead-out terminals that is closer to the side surface of the first-modified IC current measuring apparatus 500 has been modified to be connected to the first ground plane 140.

In the cross section shown in FIG. 5, a lead-out terminal 126 and the first ground plane 140 are connected to each other, and a lead-out terminal 129 and the first ground plane 140 are connected to each other.

The component-containing layer 510 is formed by modifying a part of the component-containing layer 110. That is, vias that each connect one end of a resistance element facing the substrate 102 and a corresponding lead-out terminal have been removed from the component-containing layer 110.

In the cross section shown in FIG. 5, the via 112 (see FIG. 1) and the via 116 (see FIG. 1) has been removed from the component-containing layer 110.

The wiring layer 530 is formed by modifying a part of wiring paths of the wiring layer 130. That is, wiring paths that each electrically connect one end of a resistance element facing the substrate 102 and a corresponding lead-out terminal have been removed from the wiring layer 130.

In the cross section shown in FIG. 5, the wiring that connects the lower end of the via 112 (see FIG. 1) to the lower end of the resistance element 113 (see FIG. 1) and the wiring that connects the lower end of the via 116 (see FIG. 1) to the lower end of the resistance element 115 (see FIG. 1) have been removed from the wiring layer 130.

When the first-modified IC current measuring apparatus 500 is used, a measurer who measures current flowing through each of the power source terminals of the IC 101 can measure a voltage between the upper end of a resistance element that corresponds to each power source terminal of the IC 101 targeted for measurement and the ground plane 140. For example, the measurer can measure a voltage by measuring a potential between a pair of power source terminals targeted for measurement, which correspond to the resistance element with use of a differential probe that can measure voltage between two terminals.

A potential of the ground plane 140 is the same as the ground potential of the substrate 102. Since a potential of the lower end of each resistance element is the same as the power source potential of the substrate 102, a voltage between the upper end and the lower end of each resistance element can be obtained by subtracting a voltage between the power source potential and the ground potential from a voltage between the upper end of each resistance element and the ground plane 140.

Accordingly, a measurer who measures current flowing through the power source terminals of the IC 101 can measure current flowing through each power source terminal of the IC 101 targeted for measurement.

According to the first-modified IC current measuring apparatus 500 as described above, the number of vias inserted thereinto can be decreased, compared with the IC current measuring apparatus 100 pertaining to the first embodiment.

[Third Embodiment]

As an embodiment of the IC current measuring apparatus pertaining to the present invention, a second-modified IC current measuring apparatus pertaining to a third embodiment is described below. The second-modified IC current measuring apparatus is formed by modifying a part of the first-modified IC current measuring apparatus 500 pertaining to the second embodiment.

In the first-modified IC current measuring apparatus 500, one of each pair of lead-out terminals that is closer to the side surface of the first-modified IC current measuring apparatus 500 is a lead-out terminal for measuring the ground potential. However, the second-modified IC current measuring apparatus has been modified to be provided with straight electrodes for measuring the ground potential on the main surface facing the IC 101 thereof, instead of the lead-out terminals for measuring the ground potential.

The following explains a structure of the second-modified IC current measuring apparatus pertaining to the third embodiment with reference to the drawing. The description centers on a difference from the first-modified IC current measuring apparatus pertaining to the second embodiment.

Figure 6:
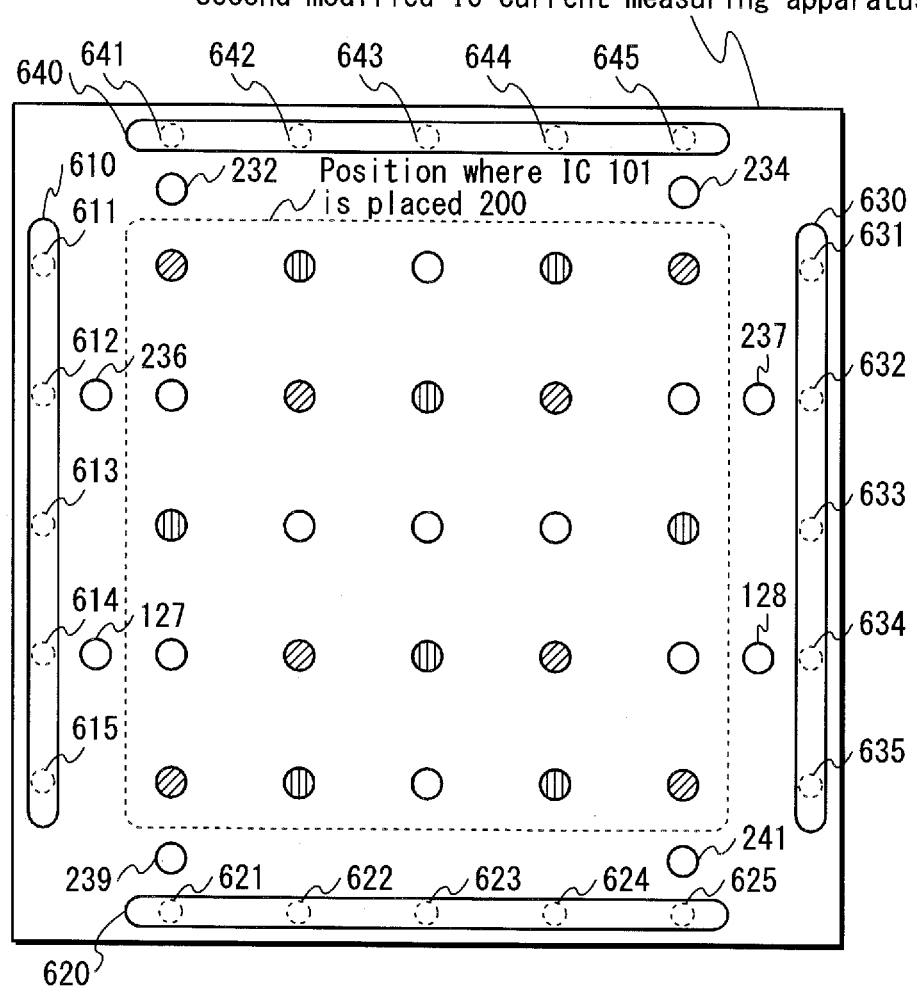
FIG. 6 is a plan view of a second-modified IC current measuring apparatus 600, as viewed from the above.

FIG. 6 is a plan view of a second-modified IC current measuring apparatus 600, as viewed from the above.

The second-modified IC current measuring apparatus 600 has been modified so that all of the lead-out terminals for measuring the ground potential are removed from the first-modified IC current measuring apparatus 500, and instead, a first electrode 610, a second electrode 620, the third electrode 630, and the fourth electrode 640 each for measuring the ground potential are added.

The first electrode 610 is a straight electrode that is connected to the first ground plane 140 through contact holes 611-615. The second electrode 620 is a straight electrode that is connected to the first ground plane 140 through contact holes 621-625. The third electrode 630 is a straight electrode that is connected to the first ground plane 140 through contact holes 631-635. The fourth electrode 640 is a straight electrode that is connected to the first ground plane 140 through contact holes 641-645.

According to the above second-modified IC current measuring apparatus 600, since the electrodes for measuring the ground potential are straight, the degree of freedom given to areas where a probe of an external measuring apparatus is connected increases, compared with the first-modified IC current measuring apparatus 500.

[Fourth Embodiment]

As an embodiment of the IC current measuring apparatus pertaining to the present invention, a third-modified IC current measuring apparatus pertaining to a fourth embodiment is described below. The third-modified IC current measuring apparatus is formed by modifying a part of the IC current measuring apparatus 100 pertaining to the first embodiment.

In the IC current measuring apparatus 100, the pairs of lead-out terminals each are used to measure a voltage between the upper end of a corresponding resistance element and the lower end of the resistance element. However, in the fourth-modified IC current measuring apparatus, the lower ends of all the resistance elements are wired with one another, and accordingly potentials of the lower ends of all the resistance elements become the same. As a result, pairs of lead-out terminals each are used to measure a difference between a potential of the upper end of a corresponding resistance element and the potential common to the lower ends of all the resistance elements.

The following describes a structure of the third-modified IC current measuring apparatus pertaining to the fourth embodiment with reference to the drawing. The description centers on a difference from the IC current measuring apparatus 100 pertaining to first embodiment.

Figure 7:
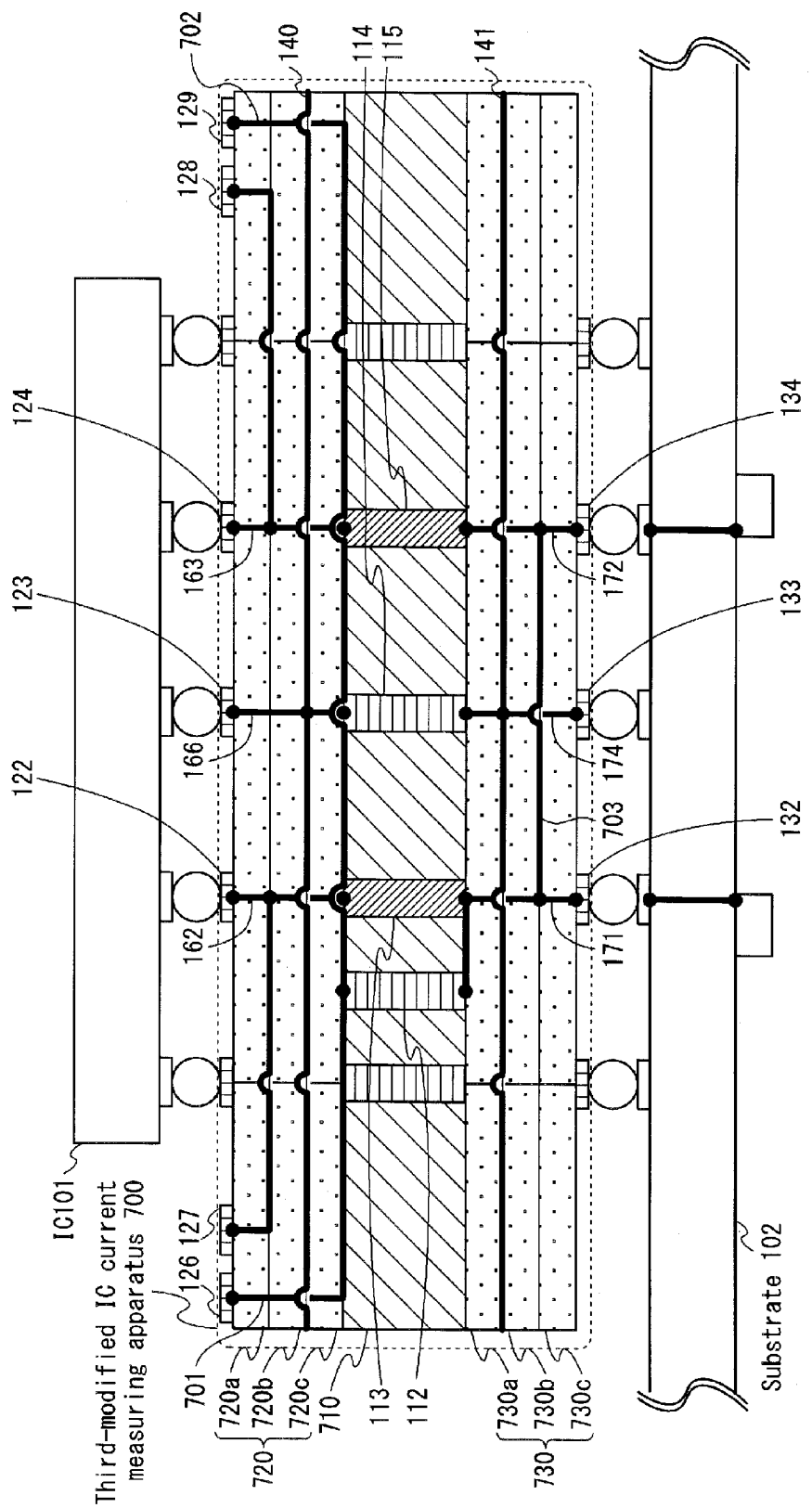
FIG. 7 is a cross-sectional view of a third-modified IC current measuring apparatus 700.

FIG. 7 is a cross-sectional view of a third-modified IC current measuring apparatus 700 that is provided between the IC 101 and the substrate 102.

The IC current measuring apparatus 100 has been modified to the third-modified IC current measuring apparatus 700 by changing the wiring layer 120 to a wiring layer 720, the component-containing layer 110 to a component-containing layer 710, and the wiring layer 130 to a wiring layer 730 so that one of each pair of lead-out terminals that is closer to the side surface of the third-modified IC current measuring apparatus 700 has the potential common to the lower ends of all the resistance elements.

The wiring layer 730 is formed by modifying a part of the wiring paths of the wiring layer 130. That is, all the power source terminals among the substrate-facing terminals have been modified to be connected to one another.

In the cross section shown in FIG. 7, a substrate-facing terminal 132 that is a power source terminal and a substrate-facing terminal 134 that is a power source terminal are connected with each other through wiring 703.

The component-containing layer 710 is formed by modifying a part of the component-containing layer 110. That is, the vias that each electrically connect one end of a resistance element facing the substrate 102 and a corresponding lead-out terminal have been removed, except for one via, from the component-containing layer 110.

In the cross section shown in FIG. 7, the via 116 (see FIG. 1) has been removed.

The wiring layer 720 is formed by modifying a part of the wiring paths of the wiring layer 120. That is, one of each pair of lead-out terminals that is closer to the side surface of the IC current measuring apparatus 100 has been modified to be connected to the upper end of a via that is connected to one end of a corresponding resistance element facing the substrate 102.

In the cross section shown in FIG. 7, the lead-out terminal 126 and the upper end of the via 112 are connected to each other through a wiring path 701, and the lead-out terminal 129 and the upper end of the via 112 are connected to each other through a wiring path 702.

According to the third-modified IC current measuring apparatus 700 as described above, the number of vias inserted thereinto can be decreased, compared with the IC current measuring apparatus 100 pertaining to the first embodiment.

[Fifth Embodiment]

As an embodiment of the IC current measuring apparatus pertaining to the present invention, a fourth-modified IC current measuring apparatus pertaining to a fifth embodiment is described below. The fourth-modified IC current measuring apparatus is formed by modifying a part of the IC current measuring apparatus 100 pertaining to the first embodiment.

The fourth-modified IC current measuring apparatus is formed by modifying the IC current measuring apparatus 100 to have a reflection inhibiting resistance element inserted into (i) each wiring path connecting a lead-out terminal and the upper end of a resistance element and (ii) each wiring path connecting a lead-out terminal and the lower end of a resistance element.

Each reflection inhibiting resistance element reduces a reflected wave that occurs when an alternating-current component included in current targeted for measurement is reflected by a lead-out terminal.

The following describes a structure of the fourth-modified IC current measuring apparatus pertaining to the fifth embodiment with reference to the drawing. The description centers on a difference from the IC current measuring apparatus 100 pertaining to first embodiment.

Figure 8:
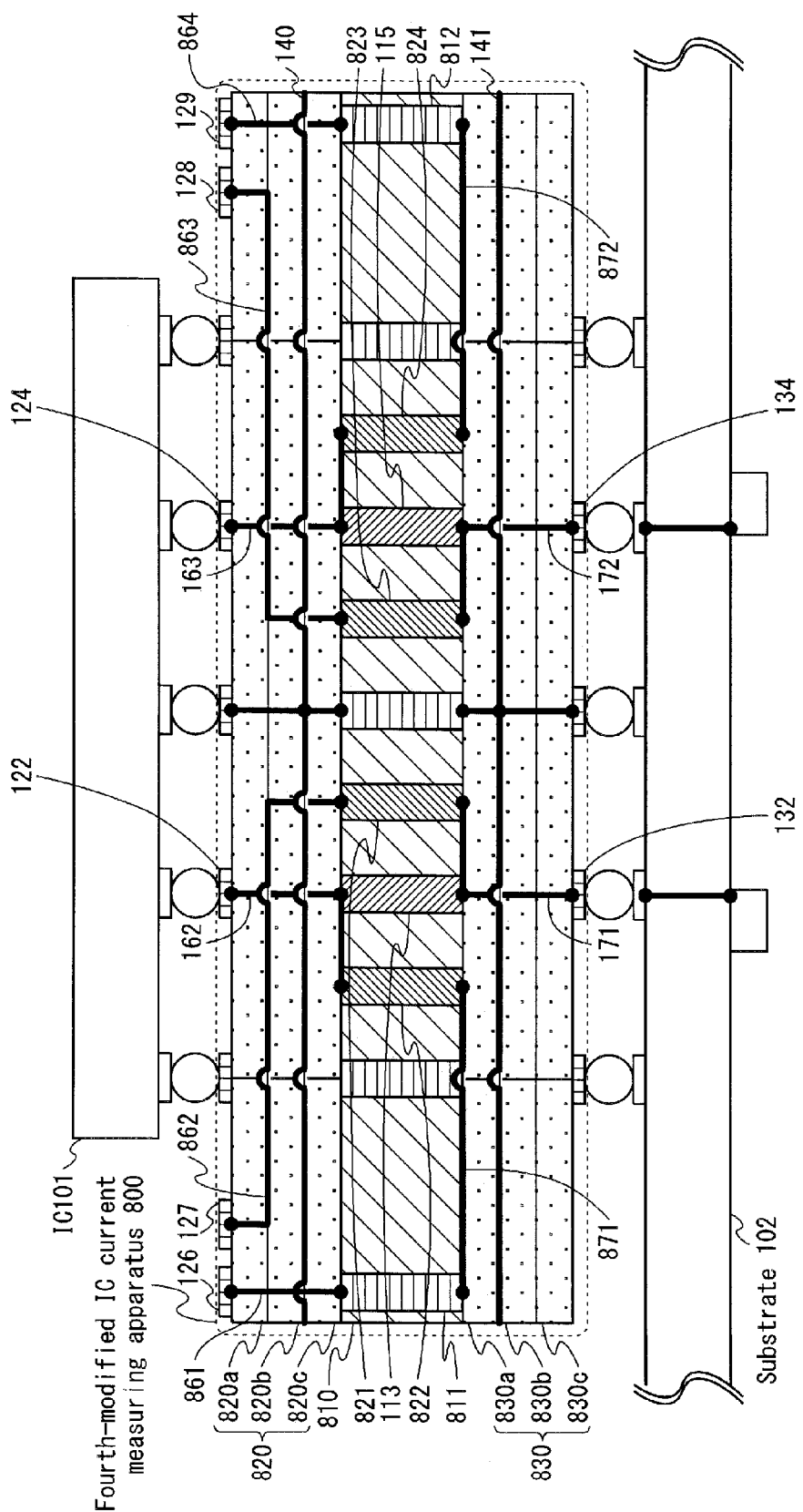
FIG. 8 is a cross-sectional view of a fourth-modified IC current measuring apparatus 800.

FIG. 8 is a cross-sectional view of a fourth-modified IC current measuring apparatus 800 that is provided between the IC 101 and the substrate 102.

The IC current measuring apparatus 100 has been modified to the fourth-modified IC current measuring apparatus 800 by changing the wiring layer 120 to a wiring layer 820, the component-containing layer 110 to a component-containing layer 810, and the wiring layer 130 to a wiring layer 830 so that the fourth-modified IC current measuring apparatus 800 has a reflection inhibiting resistance element inserted into (i) each wiring path connecting a lead-out terminal and the upper end of a resistance element and (ii) each wiring path connecting a lead-out terminal and the lower end of the resistance element.

The component-containing layer 810 is formed by modifying a part of the component-containing layer 110. That is, a reflection inhibiting resistance element located on each wiring path connecting a lead-out terminal and the upper end of a resistance element and a reflection inhibiting resistance element located on each wiring path connecting a lead-out terminal and the lower end of the resistance element are added, and locations of some vias are changed.

In the cross section shown in FIG. 8, reflection inhibiting resistance elements 821-824 are added, the via 112 (see FIG. 1) has been moved and changed to a via 811, and the via 116 (see FIG. 1) has been moved and changed to a via 812.

Each of the reflection inhibiting resistance elements 821-824 is, for example, a chip resistance whose resistance value is 100Ω and whose size is 0.6 mm×0.3 mm×0.3 mm, which is commercially available at a low price and easily accessible.

The wiring layer 830 is formed by modifying a part of the wiring layer 130. That is, a part of the wiring paths of the wiring layer 130 has been modified due to the changes of locations of some vias, and the addition of (i) a reflection inhibiting resistance element to each wiring path connecting the upper end of a resistance element and a corresponding lead-out terminal and (ii) a reflection inhibiting resistance element to each wiring path connecting the lower end of the resistance element and a corresponding lead-out terminal.

In the cross section shown in FIG. 8, a path connecting the lower end of the resistance element 113 and the lower end of the reflection inhibiting resistance element 821 has been added to a wiring path 171, a path connecting the lower end of the resistance element 115 and the lower end of a reflection inhibiting resistance element 823 has been added to the wiring path 172, a wiring path 871 connecting the lower end of a reflection inhibiting resistance element 822 and the lower end of the via 811 has been added, a wiring path 872 connecting the lower end of a reflection inhibiting resistance element 824 and the lower end of the via 812 has been added, a wiring path connecting the lower end of the resistance element 113 and the lower end of the via 112 (see FIG. 1) has been removed, and a wiring path connecting the lower end of the resistance element 115 and the lower end of the via 116 (see FIG. 1) has been removed.

The wiring layer 820 is formed by modifying a part of the wiring layer 120. That is, a part of the wiring paths of the wiring layer 120 has been modified due to the changes of locations of some vias, and the addition of (i) a reflection inhibiting resistance element to each wiring path connecting the upper end of a resistance element and a corresponding lead-out terminal and (ii) a reflection inhibiting resistance element to each wiring path connecting the lower end of the resistance element and a corresponding lead-out terminal.

In the cross section shown in FIG. 8, a path connecting the upper end of the resistance element 113 and the upper end of the reflection inhibiting resistance element 822 has been added to a wiring path 162, a wiring path 861 connecting the upper end of the via 811 and the lead-out terminal 126 has been added, a wiring path 862 connecting the upper end of the reflection inhibiting resistance element 821 and the lead-out terminal 127 has been added, a path connecting the upper end of the resistance element 115 and the upper end of the reflection inhibiting resistance element 824 has been added to a wiring path 163, a wiring path 864 connecting the upper end of the via 812 and the lead-out terminal 129 has been added, a wiring path 863 connecting the upper end of the reflection inhibiting resistance element 823 and the lead-out terminal 128 has been added, a part of the wiring path 162 (see FIG. 1) extending to the lead-out terminal 127 has been removed, the wiring path 161 (see FIG. 1) connecting the upper end of the via 112 (see FIG. 1) and the lead-out terminal 126 has been removed, and a part of the wiring path 163 (see FIG. 1) extending to the lead-out terminal 128 has been removed, and the wiring path 164 (see FIG. 1) connecting the upper end of the via 116 (see FIG. 1) and the lead-out terminal 129 has been removed.

The above fourth-modified IC current measuring apparatus 800 can reduce a reflected wave occurring when an alternating-current component included in current targeted for measurement is reflected by a lead-out terminal, compared with the IC current measuring apparatus 100 pertaining to the first embodiment.

[Sixth Embodiment]

As an embodiment of the IC current measuring apparatus pertaining to the present invention, a fifth-modified IC current measuring apparatus pertaining to a sixth embodiment is described below. The fifth-modified IC current measuring apparatus is formed by modifying a part of the IC current measuring apparatus 100 pertaining to the first embodiment.

The IC current measuring apparatus 100 measures current flowing through a current path including a terminal targeted for measurement by measuring a voltage between the upper end and the lower end of a resistance element located on the current path. However, the fifth-modified IC current measuring apparatus does not have a resistance element inserted into a current path. Instead, in vicinity to the current path, an electromagnetic wave receiving element is formed to receive an electromagnetic wave that occurs due to fluctuation of current flowing through the current path, and the current flowing through the current path is measured by measuring potentials of both ends of the electromagnetic wave receiving element.

The following describes a structure of the fifth-modified IC current measuring apparatus pertaining to the sixth embodiment with reference to the drawings. The description centers on a difference from the IC current measuring apparatus 100 pertaining to first embodiment.

Figure 9:
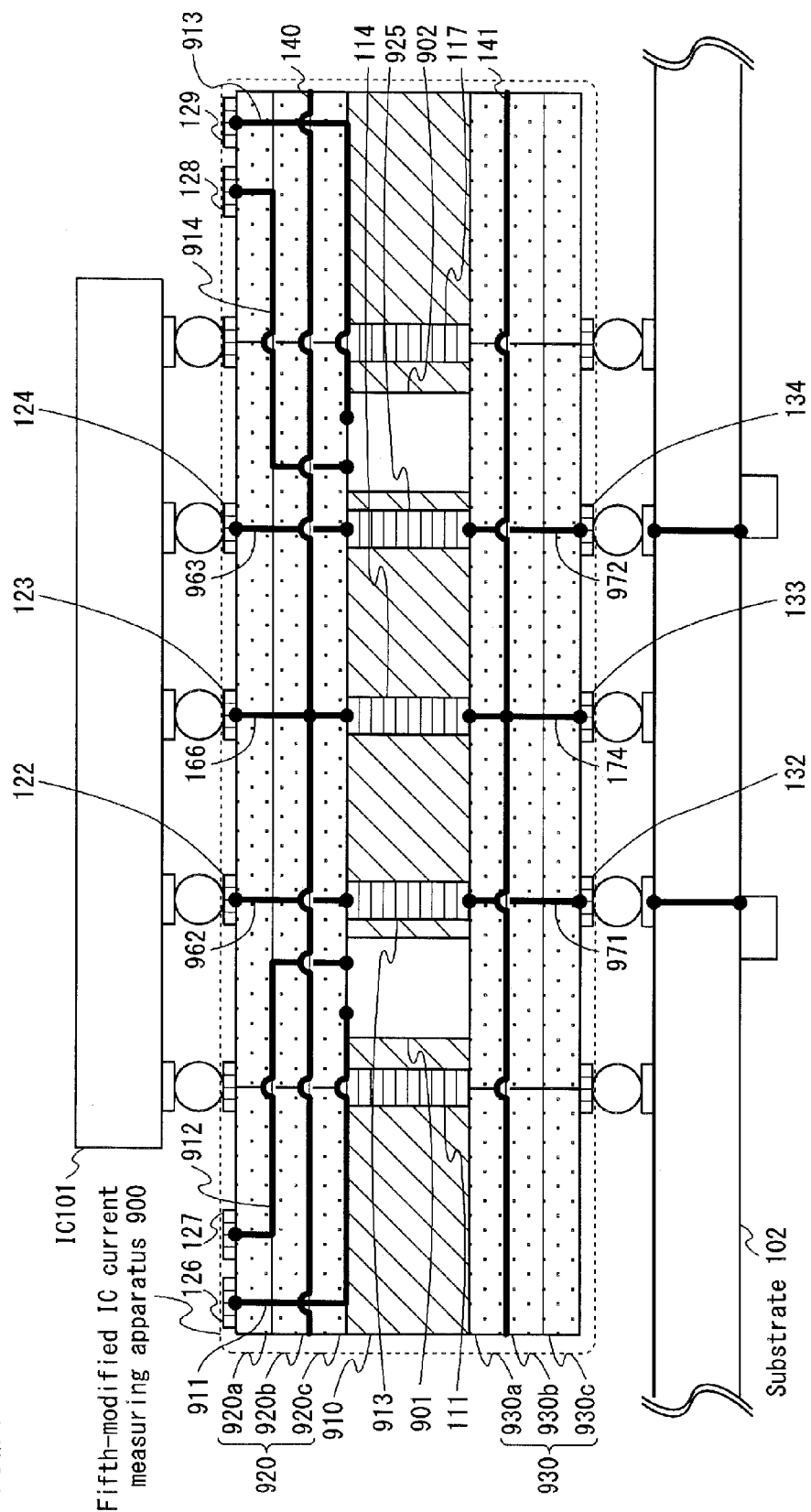
FIG. 9 is a cross-sectional view of a fifth-modified IC current measuring apparatus 900.

FIG. 9 is a cross-sectional view of a fifth-modified IC current measuring apparatus 900 that is provided between the IC 101 and the substrate 102.

The IC current measuring apparatus 100 has been modified to the fifth-modified IC current measuring apparatus 900 by modifying the wiring layer 120 to a wiring layer 920, the component-containing layer 110 to a component-containing layer 910, and the wiring layer 130 to a wiring layer 930 so that the power source terminals among the IC-facing terminals are each directly connected to a corresponding one of power source terminals among the substrate-facing terminals without resistance elements, and each pair of lead-out terminals measure a voltage between both ends of a coil formed in vicinity to a current path targeted for measurement.

The component-containing layer 910 is formed by modifying a part of the component-containing layer 110. That is, the resistance elements have been replaced with vias, and the vias each connecting the lower end of a resistance element and a corresponding lead-out terminal have been removed from the component-containing layer 110. Also, electromagnetic wave receiving elements each have been formed in vicinity to a via included in a current path targeted for measurement.

Figure 10:
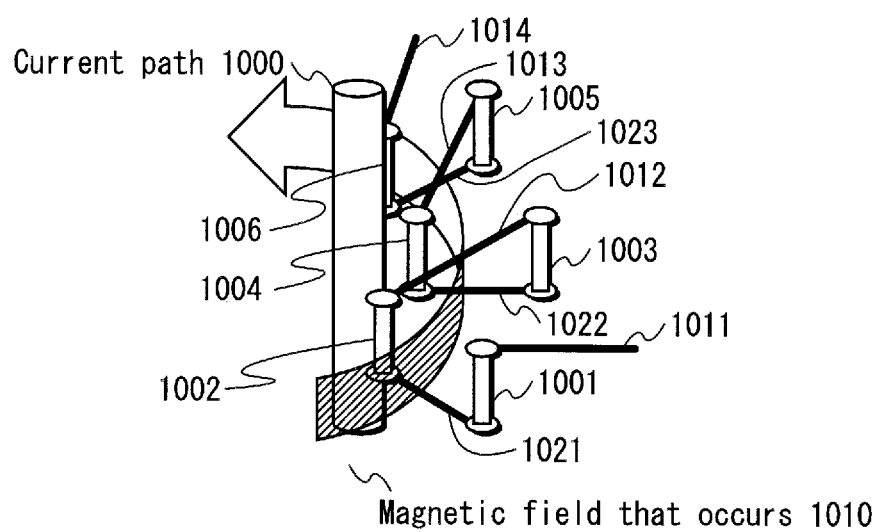
FIG. 10 is a perspective view of an electromagnetic-wave receiving element that is formed in vicinity to a current path.

FIG. 10 is a perspective view showing a structure of an electromagnetic wave receiving element that is formed in vicinity to a current path.

A current path 1000 is a path of current targeted for measurement, and is formed by a via, contact holes, and the like.

As shown in FIG. 10, a coil, which is an electromagnetic wave receiving element, is formed by vias 1001-1006, wiring 1012 and wiring 1013, and wiring 1021-1023. The wiring 1012 and wiring 1013 are formed on the bottom surface of the wiring layer 920, and the wiring 1021-1023 are formed on a surface of the wiring layer 930.

For example, a distance between the via 1002 and the current path 1000 is 0.3 mm, a distance between the via 1004 and the current path 1000 is 0.3 mm, a distance between the via 1006 and the current path 1000 is 0.3 mm, a distance between the via 1001 and the current path 1000 is 0.6 mm, a distance between the via 1003 and the current path 1000 is 0.6 mm, and a distance between the via 1005 and the current path 1000 is 0.6 mm.

When current flowing through the current path 1000 changes, fluctuation of a magnetic field 1010 occurs and a voltage occurs between both ends of the coil in accordance with the fluctuation.

To return to FIG. 9 again, the description of the component-containing layer 910 will be continued.

In the cross section shown in FIG. 9, electromagnetic wave receiving elements 901 and 902 have been added, the resistance element 113 (see FIG. 1) has been changed to a via 923, the resistance element 115 (see FIG. 1) has been changed to a via 925, and the via 112 (see FIG. 1) and the via 116 (see FIG. 1) have been removed.

The wiring layer 920 is formed by modifying a part of the wiring paths of the wiring layer 120. That is, the lead-out terminals are modified to be connected to terminals of electromagnetic wave receiving elements.

In the cross section shown in FIG. 9, a wiring path 911 connecting one terminal of the electromagnetic wave receiving element 901 and the lead-out terminal 126 has been added, a wiring path 912 connecting the other terminal of the electromagnetic wave receiving element 901 and the lead-out terminal 127 has been added, a wiring path 914 connecting one terminal of the electromagnetic wave receiving element 902 and the lead-out terminal 128 has been added, a wiring path 913 connecting the other terminal of the electromagnetic wave receiving element 902 and the lead-out terminal 129 has been added, the wiring path 161 (see FIG. 1) connecting the lead-out terminal 126 and the upper end of the via 112 (see FIG. 1) has been removed, a part of the wiring path 162 (see FIG. 1) extending to the lead-out terminal 127 has been removed, the wiring path 164 (see FIG. 1) connecting the lead-out terminal 129 and the upper end of the via 116 (see FIG. 1) has been removed, and a part of the wiring path 163 (see FIG. 1) extending to the lead-out terminal 129 has been removed.

The wiring layer 930 is formed by modifying a part of the wiring layer 130. That is, a part of wiring paths has been removed due to the removal of the wiring paths each connecting the lower end of a resistance element and a corresponding one of the lead-out terminals.

In the cross section shown in FIG. 9, a part of the wiring path 171 (see FIG. 1) extending to the lower end of the via 112 (see FIG. 1) has been removed, and a part of the wiring path 172 (see FIG. 1) extending to the lower end of the via 116 (see FIG. 1) has been removed.

The above fifth-modified IC current measuring apparatus can measure current by measuring a voltage occurring at an electromagnetic wave receiving element that is not physically in contact with a path of current targeted for measurement.

[Seventh Embodiment]

As an embodiment of the IC current measuring apparatus pertaining to the present invention, a sixth-modified IC current measuring apparatus pertaining to a seventh embodiment is described below. The sixth-modified IC current measuring apparatus is formed by modifying a part of the IC current measuring apparatus 100 pertaining to the first embodiment.

The IC current measuring apparatus 100 has been modified to the sixth-modified IC current measuring apparatus to have reflection inhibiting resistance elements each inserted into a wiring path connecting a lead-out terminal and the upper end of a corresponding resistance element and a wiring path connecting a lead-out terminal and the lower end of the corresponding resistance element, in the same way as the fourth IC current measuring apparatus 800 pertaining to the fifth embodiment.

The fourth-modified IC current measuring apparatus 800 pertaining to the fifth embodiment pertains to an example where the reflection inhibiting resistance elements are realized by the resistance elements included in the component-containing layer 810 (see FIG. 8). However, the sixth-modified IC current measuring apparatus pertaining to the seventh embodiment describes an example where reflection inhibiting resistance elements are realized by resistances formed within the wiring layer.

The following describes a structure of the sixth-modified IC current measuring apparatus pertaining to the seventh embodiment with reference to the drawing. The description centers on a difference from the IC current measuring apparatus 100 pertaining to first embodiment.

Figure 12:
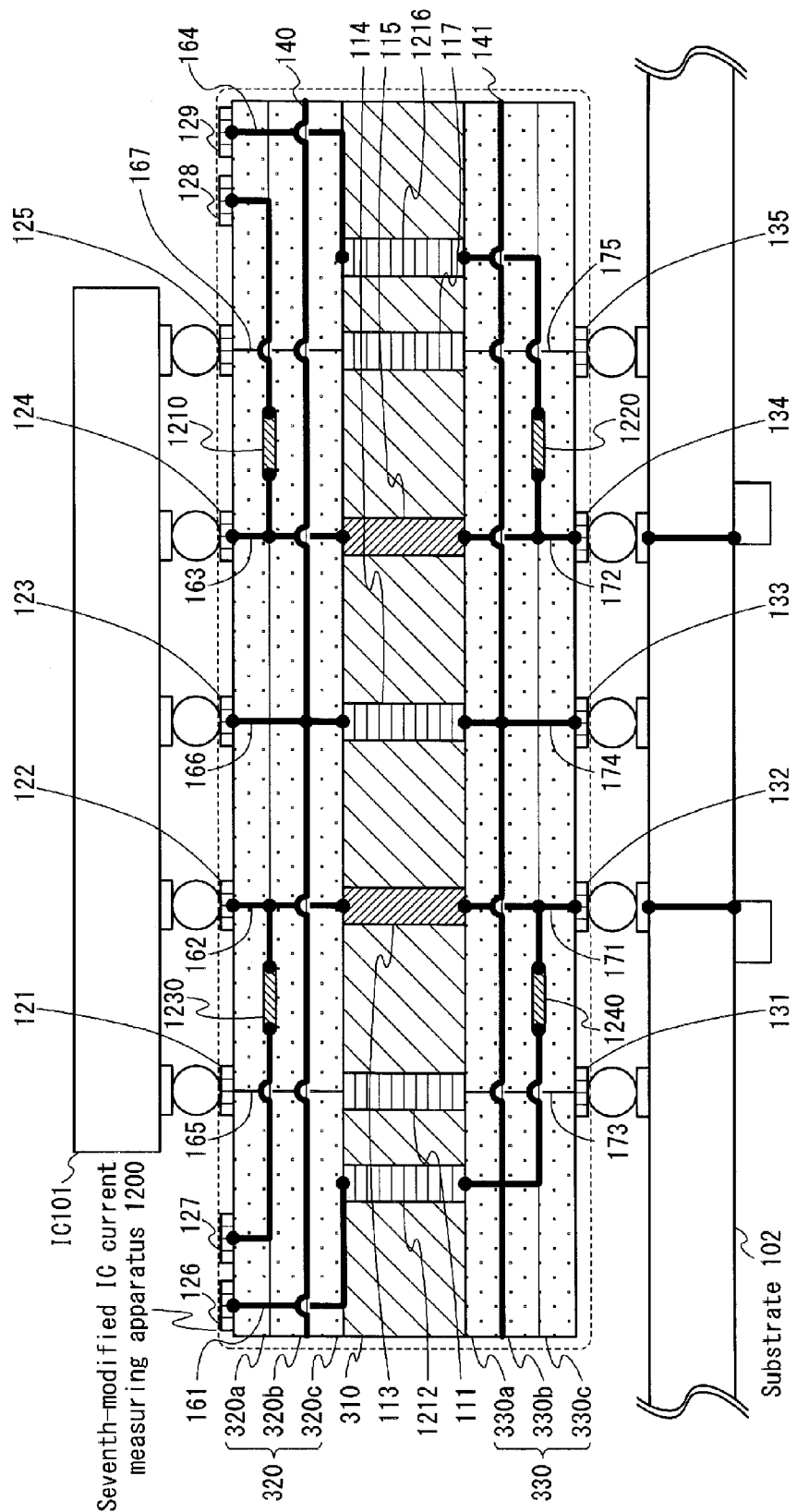
FIG. 12 is a cross-sectional view of a seventh-modified IC current measuring apparatus 1200.

FIG. 12 is a cross-sectional view of a sixth-modified IC current measuring apparatus 1200 that is provided between the IC 101 and the substrate 102.

The IC current measuring apparatus 100 has been modified to the sixth-modified IC current measuring apparatus 1200 by changing the wiring layer 120 to a wiring layer 320, the component-containing layer 110 to a component-containing layer 310, and the wiring layer 130 to a wiring layer 330 so that the sixth-modified IC current measuring apparatus 1200 has reflection inhibiting resistance elements each inserted into (i) a wiring path connecting a corresponding lead-out terminal and the upper end of a resistance element and (ii) a wiring path connecting a lead-out terminal and the lower end of the corresponding resistance element.

The component-containing layer 310 is formed by modifying a part of the component-containing layer 110 by changing locations of some vias.

In the cross section shown in FIG. 12, the via 112 (see FIG. 1) has been moved and changed to a via 1212, and the via 116 (see FIG. 1) has been moved and changed to a via 1216.

The wiring layer 320 is formed by modifying a part of the wiring layer 120. That is, a part of the wiring paths of the wiring layer 120 has been modified due to the addition of the reflection inhibiting resistance elements each to a wiring path connecting the upper end of a resistance element and a lead-out terminal and the changes of locations of some vias.

In the cross section shown in FIG. 12, a reflection inhibiting resistance element 1230 has been added to a wiring path connecting the upper end of the resistance element 113 and the lead-out terminal 127, and a reflection inhibiting resistance element 1210 has been added to a wiring path connecting the upper end of the resistance element 115 and the lead-out terminal 128.

The reflection inhibiting resistance elements 1210 and 1230 are each a resistance made of copper wiring, and formed by being trimmed by a laser trimming method, for example, and a resistance value thereof is 100Ω, for example.

The wiring layer 330 is formed by modifying a part of the wiring layer 130. That is, a part of the wiring paths of the wiring layer 130 has been modified due to the addition of the reflection inhibiting resistance elements each to a wiring path connecting the lower end of a resistance element and a corresponding lead-out terminal and the changes of locations of some vias.

In the cross section shown in FIG. 12, a reflection inhibiting resistance element 1240 has been added to a wiring path connecting the lower end of the resistance element 113 and the lead-out terminal 126, and a reflection inhibiting resistance element 1220 has been added to a wiring path connecting the lower end of the resistance element 115 and the lead-out terminal 129.

The reflection inhibiting resistance elements 1220 and 1240 are each a resistance made of copper wiring, which has been trimmed using a laser trimming method, for example, and a resistance value thereof is 100Ω, for example.

Compared with the IC current measuring apparatus 100 pertaining to the first embodiment, the above sixth-modified IC current measuring apparatus 1200 can reduce a reflected wave occurring when an alternating-current component included in current targeted for measurement is reflected by a lead-out terminal in the same manner as the fourth-modified IC current measuring apparatus 800 pertaining to the fifth embodiment, even though the component-containing layer 310 does not include a reflection inhibiting resistance element.

[Eighth Embodiment]

As an embodiment of the IC current measuring apparatus pertaining to the present invention, a lifting substrate attached to the main surface of the IC current measuring apparatus 100 facing the substrate 102 (see FIG. 1) pertaining to the first embodiment is described below.

The main surface of the lifting substrate has a rectangular shape that is the same as the main surface of the IC 101. That is, the width and height of the main surface of the lifting substrate are substantially the same as the width and height of the main surface of the IC 101. The appearance of the lifting substrate is a substantially rectangular cuboid and the thickness thereof is approximately 2 mm. The lifting substrate is connected to the substrate 102 and used while being attached to the main surface of the IC current measuring apparatus 100 facing the substrate 102. By this, a gap of approximately 2 mm is formed between the IC current measuring apparatus 100 and the substrate 102, for example.

Figure 13:
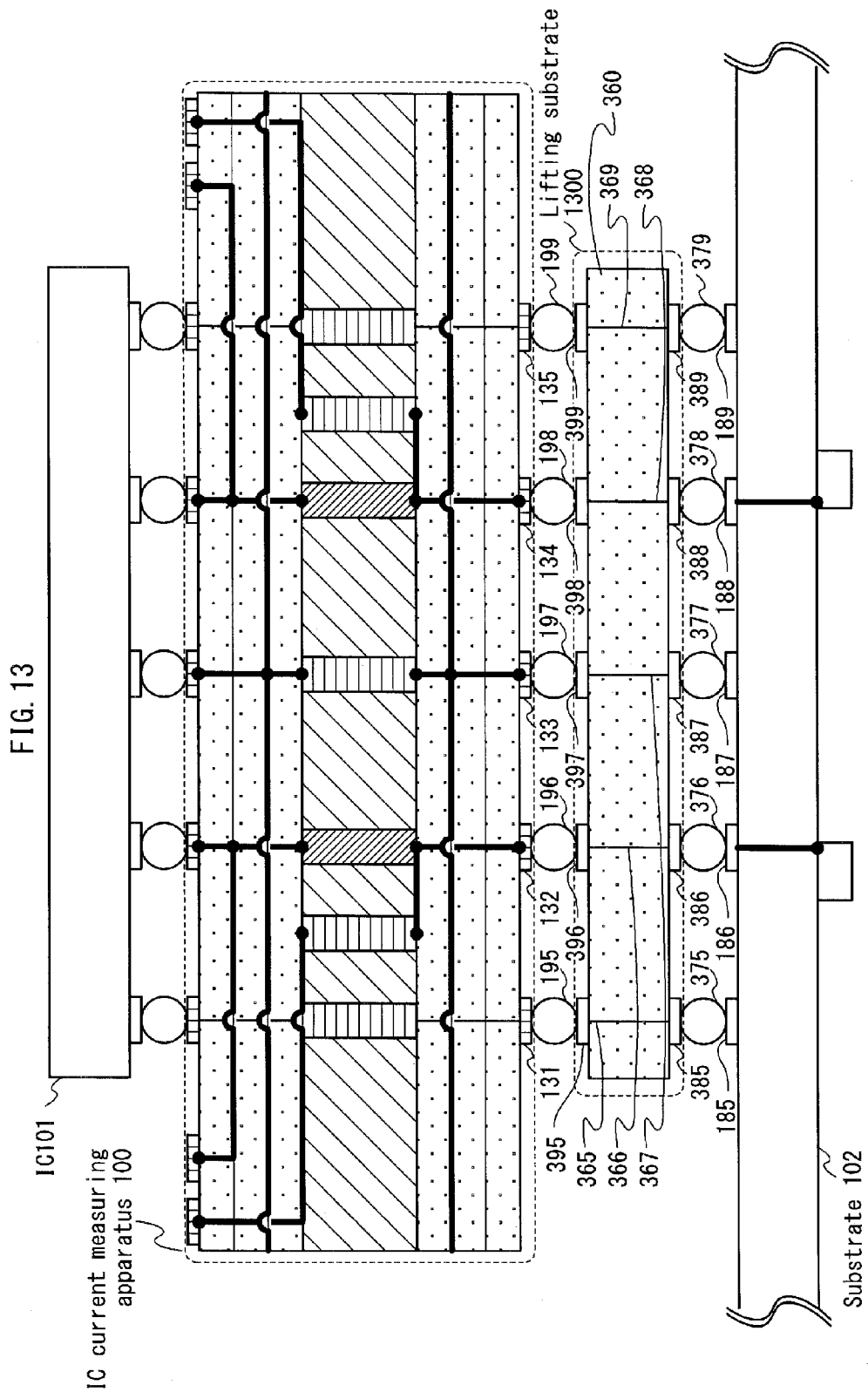
FIG. 13 is a cross-sectional view of a lifting substrate 1300.

FIG. 13 is a cross-sectional view of a lifting substrate 1300 attached to the main surface of the IC current measuring apparatus 100 facing the substrate 102, and connected to the substrate 102.

In the cross section shown in FIG. 13, the lifting substrate 1300 is provided with top-surface terminals 395-399 on the main surface thereof facing the IC current measuring apparatus 100, and bottom-surface terminals 385-389 on the main surface thereof facing the substrate 102.

When terminals unillustrated in FIG. 13 are included, the lifting substrate 1300 is provided with 25 top-surface terminals on the main surface thereof facing the IC current measuring apparatus 100, and 25 bottom-surface terminals on the main surface thereof facing the substrate 102.

Each of the 25 top-surface terminals is electrically connected to a different one of the bottom-surface terminals through a contact hole made of copper, for example.

In the cross section shown in FIG. 13, the top-surface terminals 395-399 are connected to the substrate-facing terminals 131-135 via pieces of solder 195-199, respectively, and the bottom-surface terminals 385-389 are connected to the substrate terminals 185-189 via pieces of solder 375-379, respectively.

Top-surface terminals not illustrated in FIG. 13 are each also connected to a different one of the substrate-facing terminals via pieces of solder, and bottom-surface terminals not illustrated in FIG. 13 are each also connected to a different one of the substrate terminals via pieces of solder.

When the above lifting substrate 1300 is connected to the substrate 102 while being attached to the main surface of the IC current measuring apparatus 100 facing the substrate 102, a gap is formed between the IC current measuring apparatus 100 and the substrate 102. By this, even when the IC current measuring apparatus 100 cannot be directly connected to the substrate 102 since some electronic component exists on the main surface of the substrate 102, the IC current measuring apparatus 100 can be connected to the substrate 102 through the lifting substrate 1300, by providing the lifting substrate 1300 between the IC current measuring apparatus 100 and the substrate 102.

<Supplementary Explanations>

As described above, the first embodiment through the seventh embodiment have been described as embodiments of the IC current measuring apparatus pertaining to the present invention, based on the seven examples of the IC current measuring apparatus. However, it is possible to modify the IC current measuring apparatus as below, and the present invention is of course not limited to the IC current measuring apparatus shown by the above described embodiments.

(1) The first embodiment has described that the IC current measuring apparatus 100 measures current flowing through terminals of the IC 101 that is provided with a total of 5×5=25 IC terminals packaged in the BGA package. However, the terminals of the IC targeted for measurement are not limited to be packaged in the BGA package, and may be packaged in a method different from the BGA package, such as a Quad Flat Package (QFP). Also, the IC is not limited to be provided with a total of 5×5=25 IC terminals, and may be provided with a total of 20×10=100 IC terminals, for example.

(2) In the first embodiment, it has been described that the IC current measuring apparatus 100 measures current flowing through each of the power source terminals of the IC 101. However, each terminal targeted for measurement is not limited to a power source terminal, and may be different from a power source terminal, such as a ground terminal, a digital signal output terminal, a digital signal input terminal, an analogue signal input terminal, and an analogue signal output terminal.

(3) The first embodiment has described that the resistance elements included in the component-containing layer 110 are each a chip resistance whose resistance value is 1Ω and whose size is 0.6 mm×0.3 mm×0.3 mm. However, a resistance value of each resistance element is not limited to 1Ω, the size thereof is not limited to 0.6 mm×0.3 mm×0.3 mm, and each resistance element is not limited to a chip resistance.

As a resistance element, for example, a commercially available chip resistance of 4Ω, whose size is 0.4 mm×0.2 mm×0.2 mm, such as metal wiring made of nichrome wiring, for example, having a high resistance value, can be expected.

(4) The first embodiment has described that each resistance element included in the component-containing layer 110 pierces the component-containing layer 110 between the main surface thereof facing the IC 101 and the main surface thereof facing the substrate 102. However, each resistance element may not necessarily pierce the component-containing layer 110 between the main surface thereof facing the IC 101 and the main surface thereof facing the substrate 102, if each resistance element is located on a wiring path of a terminal targeted for measurement.

Figure 11:
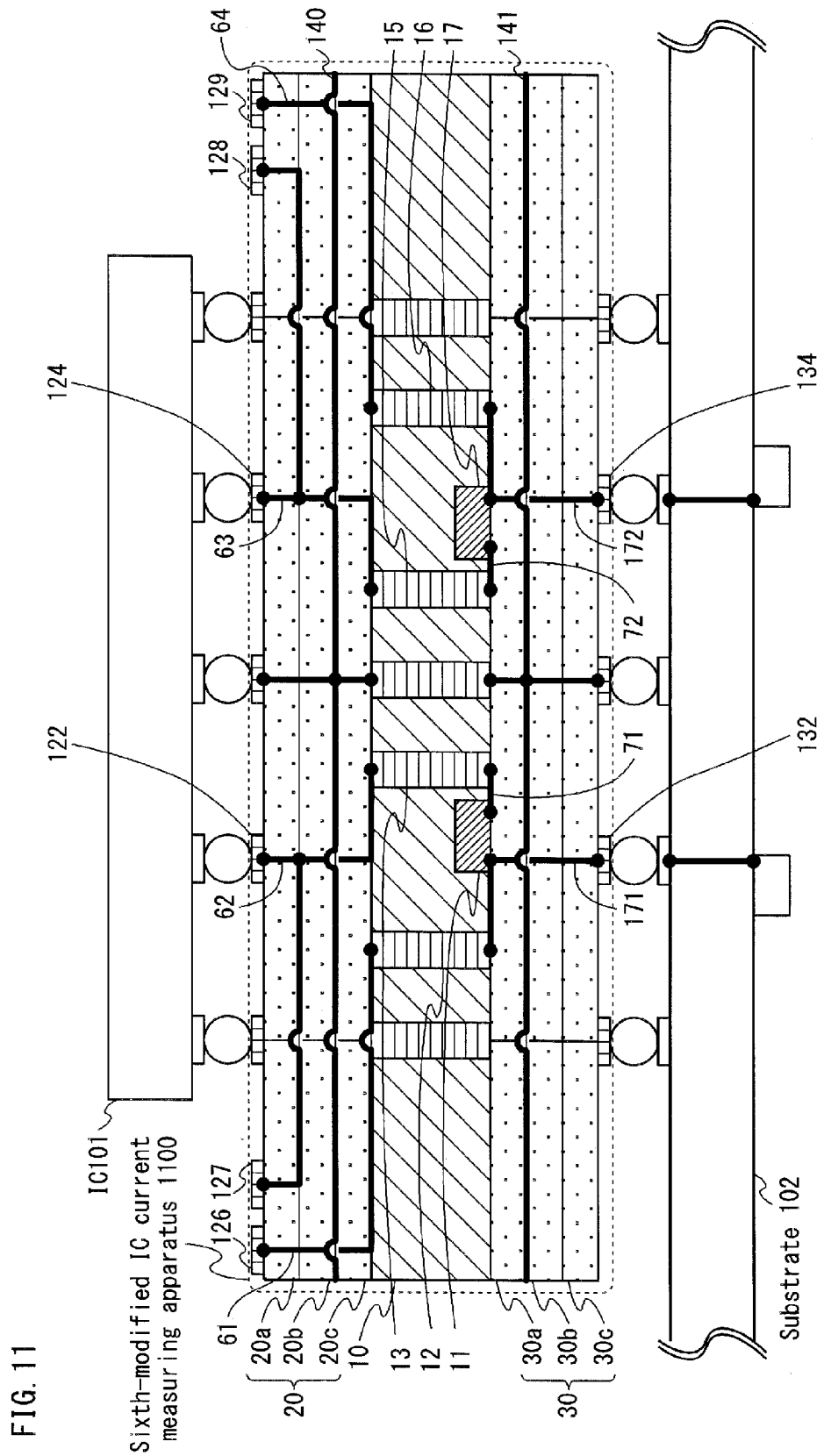
FIG. 11 is a cross-sectional view of a sixth-modified IC current measuring apparatus 1100.

FIG. 11 is a cross-sectional view of the sixth-modified IC current measuring apparatus 1100 formed by modifying a part of the IC current measuring apparatus 100 such that resistance elements included in a component-containing layer are positioned in a direction perpendicular to a line segment that connects an IC-facing terminal and a corresponding substrate-facing terminal.

In FIG. 11, a resistance element 11 is positioned to lie in a direction perpendicular to a line segment that connects the IC-facing terminal 122 and the substrate-facing terminal 132, and a resistance element 17 is positioned to lie in a direction perpendicular to a line segment that connects the IC-facing terminal 124 and the substrate-facing terminal 134.

The IC-facing terminal 122 and the substrate-facing terminal 132 are connected to each other through a wiring path 62, a via 13, a wiring path 71, the resistance element 11, and a wiring path 171. The IC-facing terminal 124 and the substrate-facing terminal 134 are connected to each other through a wiring path 63, a via 15, a wiring path 72, the resistance element 17, and the wiring path 172.

(5) The first embodiment has described that the IC current measuring apparatus 100 is connected to the IC 101 by solder. However, if each of the IC-facing terminals are each electrically connected to a different one of the terminals of the IC 101, the IC current measuring apparatus 100 may not be necessarily connected to the IC 101 by solder.

For example, an example using a socket through which the IC-facing terminals are each electrically connected to a different one of the terminals of the IC 101 can be expected.

Similarly, the first embodiment has described that the IC current measuring apparatus 100 is connected to the substrate 102 by solder. However, if the substrate-facing terminals are each electrically connected to a different one of the terminals of the substrate 102, the IC current measuring apparatus 100 may not be necessarily connected to the substrate 102 by solder.

For example, an example using a socket through which the substrate-facing terminals are each electrically connected to a different one of the terminals of the substrate 102 can be expected.

(6) In the fifth embodiment, it has been described that a resistance value of each of the reflection inhibiting resistance elements included in the component-containing layer 810 is 100Ω. However, the resistance value of each reflection inhibiting resistance element is not necessarily limited to 100Ω, if the resistance value is sufficient (i) to reduce a reflected wave from corresponding lead-out terminals when each of the lead-out terminals is a release end or (ii) to reduce a reflected wave from a corresponding terminal targeted for measurement or from an external measuring apparatus that is connected to the lead-out terminals.

As a resistance element, a commercially available chip resistance whose size is 0.4 mm×0.2 mm×0.2 mm, such as wiring made of metal such as nichrome, having a high resistance value, can be expected.

(7) The fifth embodiment has described that the reflection inhibiting resistance elements included in the component-containing layer 810 are chip resistance whose size is 0.6 mm×0.3 mm×0.3 mm. However, each of the reflection inhibiting resistance elements is not limited to a resistance whose size is 0.6 mm×0.3 mm×0.3 mm, and not necessarily limited to a chip resistance.

(8) The sixth embodiment has described an example where each electromagnetic wave receiving element is a coil. However, each electromagnetic wave receiving element is not necessarily a coil, if each electromagnetic wave receiving element (i) has mutual inductance with a current path targeted for measurement, and (ii) generates a measurable voltage in accordance with fluctuation of a magnetic field that occurs when current flowing through a current path targeted for measurement changes, for example, metal wiring (for example, made of copper) located parallel to the current path in vicinity to the current path targeted for measurement (for example, 0.3 mm) may be used.

(9) The seventh embodiment has described that each reflection inhibiting resistance element included in the wiring layer is a resistance made of copper wiring and formed by being trimmed by the laser trimming method. However, if each reflection inhibiting resistance element is made of processed wiring, each reflection inhibiting resistance element is not necessarily a resistance formed by being trimmed by the laser trimming method. For example, a resistance may be formed by replacing copper wiring with a high resistance metal such as tungsten.

(10) The following further describes a structure of an IC current measuring apparatus pertaining to the embodiment of the present invention, and its modification and its effect.

(a) The IC current measuring apparatus pertaining to the embodiment of the present invention is an IC current measuring apparatus for measuring current flowing through a plurality of terminals of an IC while being connected between the IC and a substrate, the IC current measuring apparatus comprising: a plurality of IC-facing terminals each to be connected to a different one of the plurality of terminals of the IC; a plurality of substrate-facing terminals each (i) to be connected to a different one of a plurality of terminals of the substrate and (ii) electrically connected to a different one of the plurality of IC-facing terminals; a first element to generate a voltage in accordance with current flowing between a first IC-facing terminal and one of the plurality of substrate-facing terminals that corresponds to the first IC-facing terminal, the first IC-facing terminal being one of the plurality of IC-facing terminals; a second element to generate a voltage in accordance with current flowing between a second IC-facing terminal and one of the plurality of substrate-facing terminals that corresponds to the second IC-facing terminal, the second IC-facing terminal being one of the plurality of IC-facing terminals; a first lead-out terminal to output the voltage generated by the first element to the outside; and a second lead-out terminal to output the voltage generated by the second element to the outside.

The IC current measuring apparatus with the above structure can measure (i) current flowing between the first IC-facing terminal and the substrate-facing terminal that corresponds to the first IC-facing terminal by measuring a voltage that occurs at the first element with use of the first lead-out terminal and (ii) current that flows between the second IC-facing terminal and the substrate-facing terminal that corresponds to the second IC-facing terminal by measuring a voltage that occurs at the second element with use of the second lead-out terminal.

Accordingly, the above structure offers the advantageous effect of individually measuring current that flows through the first IC-facing terminal and current that flows through the second IC-facing terminal.

Figure 14:
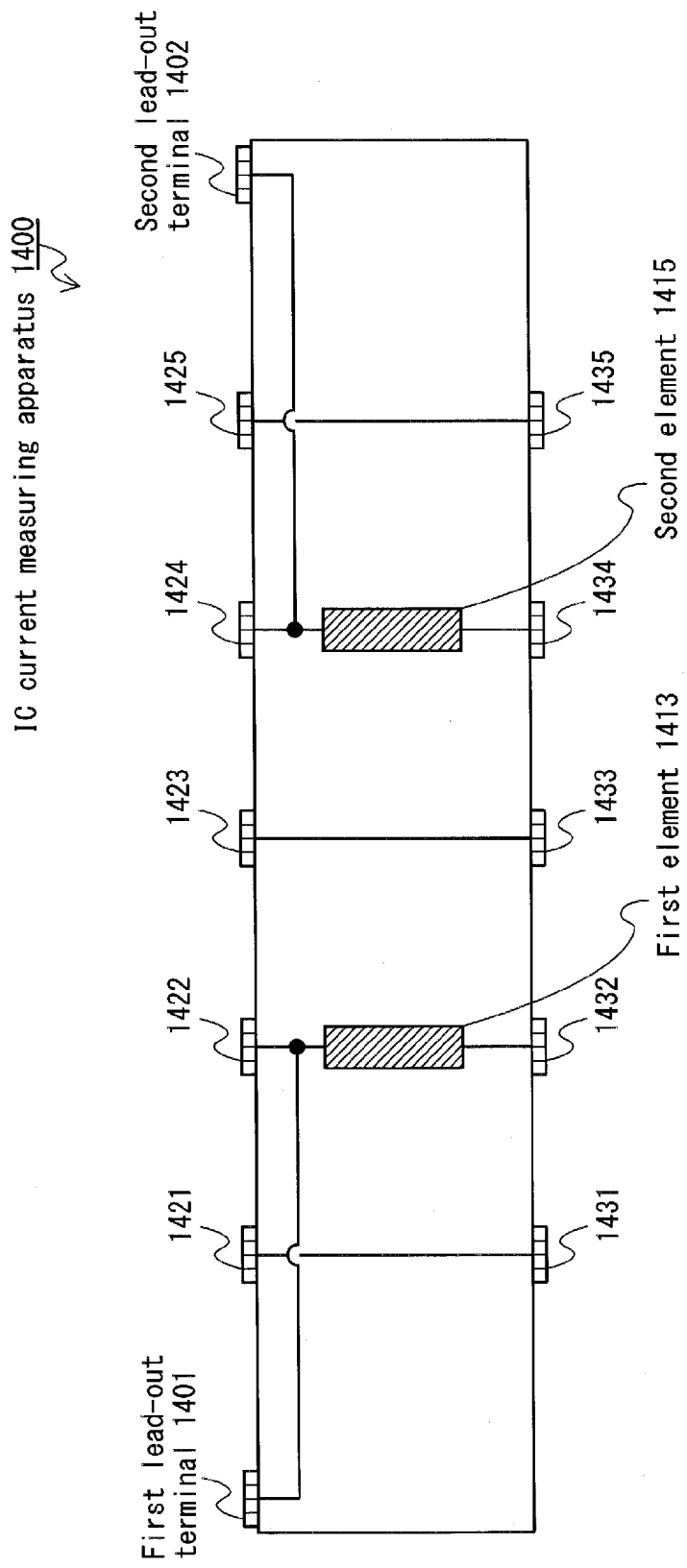
FIG. 14 is a cross-sectional view of an IC current measuring apparatus 1400.

FIG. 14 is a cross-sectional view of an IC current measuring apparatus 1400 in the above modification.

In the cross section shown in FIG. 14, the IC current measuring apparatus 1400 is provided with (i) IC-facing terminals 1421-1425, a first lead-out terminal 1401, and a second lead-out terminal 1402 on a main surface thereof facing the IC, (ii) substrate-facing terminals 1431-1435 on a main surface thereof facing the substrate, and (iii) a first element 1413 and a second element 1415 inside.

The IC-facing terminals 1421-1425 are each for being connected to a different one of a plurality of terminals of the IC. The IC-facing terminals 1421-1425 are realized as the IC-facing terminals 121-125 in the first embodiment (see FIG. 1), respectively, as an example.

The substrate-facing terminals 1431-1435 are each for being connected to a different one of a plurality of terminals of the substrate, and the substrate-facing terminals 1431-1435 are electrically connected to the IC-facing terminals 1421-1425, respectively. The substrate terminals 1431-1435 are realized as the substrate-facing terminals 131-135 in the first embodiment (see FIG. 1), respectively, as an example.

The first element 1413 generates a voltage in accordance with current flowing between the IC-facing terminal 1422 and the substrate-facing terminal 1432, and is realized as the resistance element 113 in the first embodiment (see FIG. 1), as an example.

The second element 1415 generates a voltage in accordance with current flowing between the IC-facing terminal 1424 and the substrate-facing terminal 1434, and is realized as the resistance element 115 in the first embodiment (see FIG. 1), as an example.

The first lead-out terminal 1401 is for outputting the voltage generated by the first element 1413, and is realized as the lead-out terminal 127 in the first embodiment (see FIG. 1), as an example.

The second lead-out terminal 1402 is for outputting the voltage generated by the second element 1415, and is realized as the lead-out terminal 128 in the first embodiment (see FIG. 1), as an example.

(b) Also, the first element is a resistance element connected between the first IC-facing terminal and the substrate-facing terminal that corresponds to the first IC-facing terminal, the second element is a resistance element connected between the second IC-facing terminal and the substrate-facing terminal that corresponds to the second IC-facing terminal, the first lead-out terminal is connected to one end of the first element connected to the first IC-facing terminal, and the second lead-out terminal is connected to one end of the second element connected to the second IC-facing terminal.

Such a structure yields the advantageous effect of making each of the first element and the second element as a resistance element that is easily available at a relatively low price.

(c) Also, a body of the IC current measuring apparatus has a first main surface and a second main surface that is parallel to the first main surface, and the IC current measuring apparatus further comprises: a third lead-out terminal connected, through wiring, to the other end of the first element connected to the substrate-facing terminal that corresponds to the first IC-facing terminal; and a fourth lead-out terminal connected, through wiring, to the other end of the second element connected to the substrate-facing terminal that corresponds to the second IC-facing terminal, wherein the plurality of IC-facing terminals are placed on the first main surface, the plurality of substrate-facing terminals are placed on the second main surface in opposition to the respective IC-facing terminals, the first element is embedded between the first IC-facing terminal and the substrate-facing terminal that corresponds to the first IC-facing terminal, the second element is embedded between the second IC-facing terminal and the substrate-facing terminal that corresponds to the second IC-facing terminal, the first lead-out terminal and the one end of the first element are connected to each other through wiring, and the second lead-out terminal and the one end of the second element are connected to each other through wiring.

With such a structure, a current path between the first IC-facing terminal and the substrate-facing terminal that corresponds to the first IC-facing terminal becomes the shortest path connecting the first IC-facing terminal and the substrate-facing terminal that corresponds to the first IC-facing terminal, and a current path between the second IC-facing terminal and the substrate-facing terminal that corresponds to the second IC-facing terminal becomes the shortest path connecting the second IC-facing terminal and the substrate-facing terminal that corresponds to the second IC-facing terminal.

Accordingly, the above structure offers the advantageous effect of reducing effects to high-frequency current and stabling system operation by preventing increase of parasitic resistance and parasitic inductance in a current path targeted for measurement.

(d) Also, when the body is connected to the IC, the first lead-out terminal, the second lead-out terminal, the third lead-out terminal and the fourth lead-out terminal are placed on areas of the first main surface that are not covered with the IC.

With such a structure, the first lead-out terminal, the second lead-out terminal, the third lead-out terminal, and the fourth lead-out terminal are placed at positions easily visually recognized. Therefore, the above structure offers the advantageous effect in which a measurer who measures potentials of the above terminals using a measuring instrument can easily connect a probe of the measuring instrument to the above terminals.

(e) Also, the IC current measuring apparatus comprises a third element that is a resistance element; and a fourth element that is a resistance element, wherein the first lead-out terminal and the one end of the first element are connected to each other through the third element and wiring, and the second lead-out terminal and the one end of the second element are connected to each other through the fourth element and wiring.

The above structure offers the advantageous effect of reducing a reflected wave that occurs when a part of an alternating-current component included in current flowing through the first element is reflected by the first lead-out terminal, and a reflected wave that occurs when a part of an alternating-current component included in current flowing through the second element is reflected by the second lead-out terminal.

(f) Also, the third element and the fourth element are made of wiring that has been processed to be resistive.

The above structure offers the advantageous effect of providing the third element and the fourth element in an area of a wiring layer where wiring exists.

(g) Also, a body of the IC current measuring apparatus has a main surface, wherein one of the plurality of substrate-facing terminals is a substrate-facing ground terminal to be connected to ground wiring of the substrate, one or more of the plurality of IC-facing terminals are one or more IC-facing ground terminals electrically connected to the substrate-facing ground terminal, at least one of the IC-facing ground terminals, the plurality of IC-facing terminals, the first lead-out terminal and the second lead-out terminal are placed on the main surface, a distance between the at least one IC-facing ground terminal and the first lead-out terminal is equal to or less than 1.5 mm, and a distance between the at least one IC-facing ground terminal and the second lead-out terminal is equal to or less than 1.5 mm.

With such a structure, a distance between the first lead-out terminal and the at least one IC-facing ground terminal is equal to or less than 1.5 mm, and accordingly the above structure offers the advantageous effect of making measurement of a difference between a potential of the first lead-out terminal and the ground potential relatively easy with use of a device such as a differentiate probe and a probe of a spectrum analyzer that are the commercially available.

Similarly, a distance between the second lead-out terminal and the at least one IC-facing ground terminal is equal to or less than 1.5 mm, and accordingly the above structure offers the advantageous effect of making measurement of a difference between a potential of the second lead-out terminal and the ground potential relatively easy with use of a differentiate probe and a probe of a spectrum analyzer that are the commercially available.

(h) Also, the IC current measuring apparatus further comprises a third lead-out terminal, wherein the first IC-facing terminal is to be connected to a first power source terminal of the IC, the first power source terminal being one of the plurality of terminals of the IC, the second IC-facing terminal is to be connected to a second power source terminal of the IC, the second power source terminal being one of the plurality of terminals of the IC, and the third lead-out terminal is electrically connected to (i) the other end of the first element connected to the substrate-facing terminal that corresponds to the first IC-facing terminal and (ii) the other end of the second element connected to the substrate-facing terminal that corresponds to the second IC-facing terminal.

With such a structure, the third lead-out terminal is used as (i) a terminal for measuring a potential of one side of the first element facing the corresponding substrate-facing terminal, and (ii) a terminal for measuring a potential of one side of the second element facing the substrate-facing terminal at the same time. Accordingly, the above structure offers the advantageous effect of reducing the number of terminals, compared with a structure providing two terminals that are different from each other without using one terminal as the two terminals.

(i) Also, the first element is an electromagnetic wave receiving element to receive an electromagnetic wave generated by the current flowing between the first IC-facing terminal and the substrate-facing terminal that corresponds to the first IC-facing terminal, and the second element is an electromagnetic wave receiving element to receive an electromagnetic wave generated by the current flowing between the second IC-facing terminal and the substrate-facing terminal that corresponds to the second IC-facing terminal.

With such a structure, a current path between the first IC-facing terminal and the substrate-facing terminal that corresponds to the first IC-facing terminal and the first element are not physically in contact with each other, and a current path between the second IC-facing terminal and the substrate-facing terminal that corresponds to the second IC-facing terminal and the second element are not physically in contact with each other.

Accordingly, the above structure has the advantageous effect of reducing an effect to current paths that results from physical contact between an element generating a voltage in accordance with current and a current path, compared with a structure according to which the element generating a voltage in accordance with current and a current path are physically in contact with each other.

(j) Also, the IC current measuring apparatus, further comprises: a third lead-out terminal; and a fourth lead-out terminal, wherein the first element is a coil connected between the first lead-out terminal and the third lead-out terminal, a distance from the first element to a current path between the first IC-facing terminal and the substrate-facing terminal that corresponds to the first IC-facing terminal is equal to or less than a predetermined distance, the predetermined distance being suitable for the first element to receive the electromagnetic wave generated by the current flowing between the first IC-facing terminal and the substrate-facing terminal that corresponds to the first IC-facing terminal, the second element is a coil connected between the second lead-out terminal and the fourth lead-out terminal, and a distance from the second element to a current path between the second IC-facing terminal and the substrate-facing terminal that corresponds to the second IC-facing terminal is equal to or less than a predetermined distance, the predetermined distance being suitable for the second element to receive the electromagnetic wave generated by the current flowing between the second IC-facing terminal and the substrate-facing terminal that corresponds to the second IC-facing terminal.

Here, a predetermined distance means a distance suitable for the first element or the second element to have mutual inductance with a current path targeted for measurement and generate a measurable voltage in accordance with fluctuation of a magnetic field that occurs when current flowing through the current path that is targeted for measurement changes.

With such a structure, the first element and the second element can effectively receive fluctuation of a magnetic field generated by current targeted for measurement, and accordingly the above structure offers the advantageous effect of making the IC current measuring apparatus small.

(k) Also, the second main surface has a rectangular shape. The above structure offers the advantageous effect of realizing formation of the second main surface with a relatively simple method.

(1) An IC current measuring adapter pertaining to the embodiment of the present invention connected between the IC current measuring apparatus and the substrate, connecting the plurality of substrate-facing terminals of the IC current measuring apparatus and the respective terminals of the substrate, wherein the IC current measuring adapter is a substantially rectangular cuboid having a third main surface and a fourth main surface that is parallel to the third main surface, a plurality of first adapter terminals each to be connected to a different one of the plurality of the substrate-facing terminals are placed on the third main surface and a plurality of second adapter terminals each (i) to be connected to a different one of the terminals of the substrate and (ii) connected to a different one of the respective first adapter terminals are placed on the fourth main surface, and a width and height of the third main surface are each smaller than a width and height of the second main surface.

When the IC current measuring adapter with the above structure is provided between the IC current measuring apparatus and the substrate, a gap is formed between the IC current measuring apparatus and the substrate. By this, even when the IC current measuring apparatus cannot be directly connected to the substrate since some electronic component exists on the main surface of the substrate, by providing the IC current measuring adapter between the IC current measuring apparatus and the substrate, the IC current measuring apparatus can be connected to the substrate through the IC current measuring adapter.

The present invention is useful in measuring current flowing through terminals of the IC.

REFERENCE SIGNS LIST

100 IC current measuring apparatus
101 IC
102 substrate
110 component-containing layer
111, 112, 114, 116, 117 via
113, 115 resistance element
120 wiring layer
121-125 IC-facing terminal
126-129 lead-out terminal
130 wiring layer
131-135 substrate-facing terminal
140 first ground plane
141 second ground plane
148, 149 by-pass capacitor
158, 159 wiring path within substrate
161-167, 171-175 wiring path
180-184 terminal of IC 101
185-189 terminal of substrate 102
190-199 solder

The invention claimed is:
1. An IC current measuring apparatus for measuring current flowing through a plurality of terminals of an IC while being connected between the IC and a substrate, the IC current measuring apparatus comprising:
 a plurality of IC-facing terminals each to be connected to a different one of the plurality of terminals of the IC;
 a plurality of substrate-facing terminals each (i) to be connected to a different one of a plurality of terminals of the substrate and (ii) electrically connected to a different one of the plurality of IC-facing terminals;
 a first element to generate a voltage in accordance with current flowing between a first IC-facing terminal and one of the plurality of substrate-facing terminals that corresponds to the first IC-facing terminal, the first IC-facing terminal being one of the plurality of IC-facing terminals;
 a second element to generate a voltage in accordance with current flowing between a second IC-facing terminal and one of the plurality of substrate-facing terminals that corresponds to the second IC-facing terminal, the second IC-facing terminal being one of the plurality of IC-facing terminals;

a first lead-out terminal to output the voltage generated by the first element to the outside, the voltage indicating a potential difference between the first IC-facing terminal and the one of the plurality of substrate-facing terminals corresponding to the first IC-facing terminal; and a second lead-out terminal to output the voltage generated by the second element to the outside, the voltage indicating a potential difference between the second IC-facing terminal and the one of the plurality of substrate-facing terminals corresponding to the second IC-facing terminal.

2. The IC current measuring apparatus of claim 1, wherein the first element is a resistance element connected between the first IC-facing terminal and the substrate-facing terminal that corresponds to the first IC-facing terminal, the second element is a resistance element connected between the second IC-facing terminal and the substrate-facing terminal that corresponds to the second IC-facing terminal, the first lead-out terminal is connected to one end of the first element connected to the first IC-facing terminal, and the second lead-out terminal is connected to one end of the second element connected to the second IC-facing terminal.

3. The IC current measuring apparatus of claim 2, a body thereof having a first main surface and a second main surface that is parallel to the first main surface, the IC current measuring apparatus further comprising:

a third lead-out terminal connected, through wiring, to the other end of the first element connected to the substrate-facing terminal that corresponds to the first IC-facing terminal; and a fourth lead-out terminal connected, through wiring, to the other end of the second element connected to the substrate-facing terminal that corresponds to the second IC-facing terminal, wherein the plurality of IC-facing terminals are placed on the first main surface, the plurality of substrate-facing terminals are placed on the second main surface in opposition to the respective IC-facing terminals, the first element is embedded between the first IC-facing terminal and the substrate-facing terminal that corresponds to the first IC-facing terminal, the second element is embedded between the second IC-facing terminal and the substrate-facing terminal that corresponds to the second IC-facing terminal, the first lead-out terminal and the one end of the first element are connected to each other through wiring, and the second lead-out terminal and the one end of the second element are connected to each other through wiring.

4. The IC current measuring apparatus of claim 3, wherein when the body is connected to the IC, the first lead-out terminal, the second lead-out terminal, the third lead-out terminal and the fourth lead-out terminal are placed on areas of the first main surface that are not covered with the IC.

5. The IC current measuring apparatus of claim 2, further comprising:

a third element that is a resistance element; and a fourth element that is a resistance element, wherein the first lead-out terminal and the one end of the first element are connected to each other through the third element and wiring, and the second lead-out terminal and the one end of the second element are connected to each other through the fourth element and wiring.

6. The IC current measuring apparatus of claim 5, wherein the third element and the fourth element are made of wiring that has been processed to be resistive.

7. The IC current measuring apparatus of claim 2, a body thereof having a main surface, wherein one of the plurality of substrate-facing terminals is a substrate-facing ground terminal to be connected to ground wiring of the substrate, one or more of the plurality of IC-facing terminals are one or more IC-facing ground terminals electrically connected to the substrate-facing ground terminal, at least one of the IC-facing ground terminals, the plurality of IC-facing terminals, the first lead-out terminal and the second lead-out terminal are placed on the main surface, a distance between the at least one IC-facing ground terminal and the first lead-out terminal is equal to or less than 1.5 mm, and a distance between the at least one IC-facing ground terminal and the second lead-out terminal is equal to or less than 1.5 mm.

8. The IC current measuring apparatus of claim 2, further comprising a third lead-out terminal, wherein the first IC-facing terminal is to be connected to a first power source terminal of the IC, the first power source terminal being one of the plurality of terminals of the IC, the second IC-facing terminal is to be connected to a second power source terminal of the IC, the second power source terminal being one of the plurality of terminals of the IC, and the third lead-out terminal is electrically connected to (i) the other end of the first element connected to the substrate-facing terminal that corresponds to the first IC-facing terminal and (ii) the other end of the second element connected to the substrate-facing terminal that corresponds to the second IC-facing terminal.

9. The IC current measuring apparatus of claim 1, wherein the first element is an electromagnetic wave receiving element to receive an electromagnetic wave generated by the current flowing between the first IC-facing terminal and the substrate-facing terminal that corresponds to the first IC-facing terminal, and the second element is an electromagnetic wave receiving element to receive an electromagnetic wave generated by the current flowing between the second IC-facing terminal and the substrate-facing terminal that corresponds to the second IC-facing terminal.

10. The IC current measuring apparatus of claim 9, further comprising:

a third lead-out terminal; and a fourth lead-out terminal, wherein the first element is a coil connected between the first lead-out terminal and the third lead-out terminal, a distance from the first element to a current path between the first IC-facing terminal and the substrate-facing terminal that corresponds to the first IC-facing terminal is equal to or less than a predetermined distance, the predetermined distance being suitable for the first element to receive the electromagnetic wave generated by the current flowing between the first IC-facing terminal and the substrate-facing terminal that corresponds to the first IC-facing terminal, the second element is a coil connected between the second lead-out terminal and the fourth lead-out terminal, and a distance from the second element to a current path between the second IC-facing terminal and the substrate-facing terminal that corresponds to the second IC-facing terminal is equal to or less than a predetermined distance, the predetermined distance being suitable for the second element to receive the electromagnetic wave generated by the current flowing between the second IC-facing terminal and the substrate-facing terminal that corresponds to the second IC-facing terminal.

11. The IC current measuring apparatus of claim 3, wherein the second main surface has a rectangular shape.

* * * * *